United States Patent
Kalliakos et al.

(10) Patent No.: US 9,761,756 B2
(45) Date of Patent: Sep. 12, 2017

(54) OPTICAL DEVICE AND A METHOD OF FABRICATING AN OPTICAL DEVICE

(71) Applicant: KABUSHIKI KAISHA TOSHIBA, Tokyo (JP)

(72) Inventors: Sokratis Kalliakos, Cambridge (GB); Joanna Krystyna Skiba-Szymanska, Cambridge (GB); David Julian Peter Ellis, Cambridge (GB); Andrew James Shields, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/861,497

(22) Filed: Sep. 22, 2015

(65) Prior Publication Data

US 2016/0240728 A1    Aug. 18, 2016

(30) Foreign Application Priority Data

Feb. 12, 2015   (GB) .................................. 1502340.1

(51) Int. Cl.
*H01L 33/06* (2010.01)
*H01L 33/38* (2010.01)
(Continued)

(52) U.S. Cl.
CPC .......... *H01L 33/06* (2013.01); *H01L 33/0062* (2013.01); *H01L 33/38* (2013.01);
(Continued)

(58) Field of Classification Search
CPC ....... H01L 33/06; H01L 33/005; H01L 33/38; H01L 33/507; H01L 33/58; H01L 33/62;
(Continued)

(56) References Cited

U.S. PATENT DOCUMENTS 7,813,401 B2   10/2010   Scherer
8,471,352 B2    6/2013   Ellis et al.
(Continued)

FOREIGN PATENT DOCUMENTS

CN   101499617   8/2009
JP   2006-319028   11/2006
(Continued)

OTHER PUBLICATIONS

"Design proposal for a low loss in-plane active photonic crystal waveguide with vertical electrical carrier injection" by Kappeler on Apr. 9, 2012, vol. 20, No. 8, Optics Express.*

(Continued)

*Primary Examiner* — Moazzam Hossain
*Assistant Examiner* — Farun Lu
(74) *Attorney, Agent, or Firm* — Finnegan, Henderson, Farabow, Garrett & Dunner, L.L.P.

(57) ABSTRACT

An optical device comprising: a photonic crystal structure, comprising: a layer of a first material, the layer comprising a quantum emitter; and a plurality of regions of a second material in the layer of the first material, the regions arranged in a regular lattice having at least one region missing from the lattice so that a defect is formed, wherein the quantum emitter is located in the defect part of the photonic crystal structure; wherein the second material has a different refractive index to the first material; and an electrode which is electrically contacted to only the defect part of the photonic crystal structure.

15 Claims, 18 Drawing Sheets

(51) Int. Cl.
*H01L 33/00* (2010.01)
*H01L 33/30* (2010.01)
*H01L 33/42* (2010.01)
*H01L 33/44* (2010.01)

(52) U.S. Cl.
CPC .............. *H01L 33/30* (2013.01); *H01L 33/42* (2013.01); *H01L 33/44* (2013.01); *H01L 2933/0016* (2013.01); *H01L 2933/0025* (2013.01); *H01L 2933/0058* (2013.01); *H01L 2933/0083* (2013.01)

(58) Field of Classification Search
CPC ..... H01L 2933/0016; H01L 2933/0025; H01L 2933/0033; H01L 2933/0058
See application file for complete search history.

(56) References Cited

U.S. PATENT DOCUMENTS

| | | | |
|---|---|---|---|
| 2006/0273429 A1 | 12/2006 | Sakamoto et al. | |
| 2008/0080579 A1 | 4/2008 | Scherer | |
| 2009/0225804 A1 | 9/2009 | Sasahata et al. | |
| 2011/0008000 A1* | 1/2011 | Tokushima | B82Y 20/00 385/21 |
| 2011/0108744 A1* | 5/2011 | Stevenson | B82Y 10/00 250/493.1 |
| 2011/0248242 A1 | 10/2011 | Ellis et al. | |
| 2012/0155502 A1 | 6/2012 | Matsuo et al. | |
| 2012/0300796 A1* | 11/2012 | Sysak | H01S 5/1032 372/6 |
| 2013/0092897 A1 | 4/2013 | Shambat et al. | |
| 2013/0105927 A1* | 5/2013 | Shigeta | H01L 31/0248 257/432 |
| 2013/0256504 A1* | 10/2013 | Stevenson | G02F 1/2257 250/201.1 |
| 2014/0356791 A1* | 12/2014 | Liu | G03F 7/2059 430/296 |

FOREIGN PATENT DOCUMENTS

| | | |
|---|---|---|
| JP | 2008-065317 | 3/2008 |
| JP | 2006-179573 | 7/2008 |
| JP | 2009-218489 | 9/2009 |
| JP | 2009-239260 | 10/2009 |
| JP | 2014-150151 | 8/2014 |

OTHER PUBLICATIONS

Park, H. et al., "Electrically Driven Single-Cell Photonic Crystal Laser", Science, vol. 305, pp. 1444-1447, (2004).

Chakravarty, S. et al., "Electrically injected quantum dot photonic crystal microcavity light emitters and microcavity arrays", Journal of Physics D: Applied Physics, vol. 40, pp. 2683-2690, (2007).

Kappeler, R. et al., "Design proposal for a low loss in-plane active photonic crystal waveguide with vertical electrical carrier injection", Optics Express 9264, vol. 20, No. 8, pp. 1-12, (2012).

Search Report dated Jun. 28, 2015, and Examination Report dated Jun. 28, 2015, from the UK Patent Office in counterpart Great Britain Application No. GB1502340.1, 2 pages.

Notification of Reasons for Refusal issued in counterpart Japanese Application No. 2015-240054, dated Jan. 27, 2017, 3 pages, and machine translation.

* cited by examiner

OPTICAL DEVICE AND A METHOD OF FABRICATING AN OPTICAL DEVICE

FIELD

Embodiments described herein relate generally to optical devices, for example devices in the field of quantum optics such as quantum light sources and waveguides for quantum optical circuits, and methods of fabricating these devices.

BACKGROUND

Quantum optics applications include quantum cryptography, quantum computing and other photonic based technologies. Quantum optical devices may involve one section where photon generation occurs, a second section where photon manipulation occurs and a third section where photon detection occurs. An integrated optical circuit comprises multiple sections on a single optical chip having means to transport photons between the sections. There is a continuing need to produce lower cost, simplified integrated optical circuits.

BRIEF DESCRIPTION OF THE FIGURES

Devices and methods in accordance with non-limiting embodiments will now be described with reference to the accompanying figures in which.

DETAILED DESCRIPTION

Figure 1:
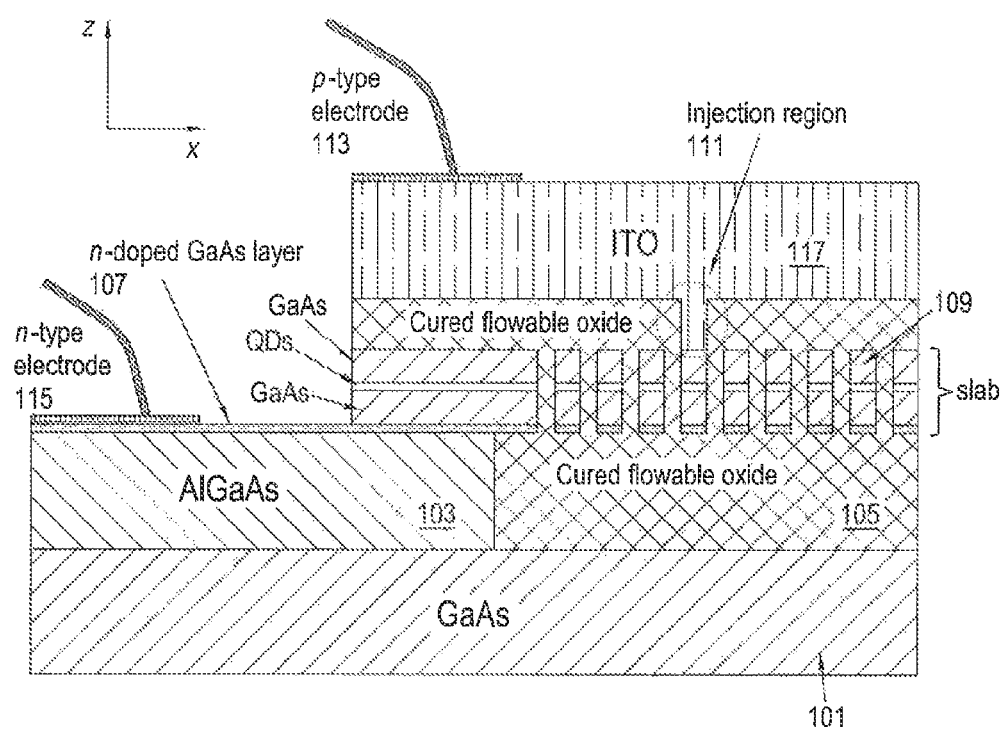
FIG. 1 is a schematic illustration of an optical device in accordance with an embodiment.

According to one embodiment, there is provided an optical device comprising: a photonic crystal structure, comprising: a layer of a first material, the layer comprising a quantum emitter; and a plurality of regions of a second material in the layer of the first material, the regions arranged in a regular lattice having at least one region missing from the lattice so that a defect is formed, wherein the quantum emitter is located in the defect part of the photonic crystal structure; wherein the second material has a different refractive index to the first material. An electrode is electrically contacted to only the defect part of the photonic crystal structure.

There may be more than one quantum emitter. The quantum emitter may be a quantum dot. In one embodiment, the layer of the first material comprises a layer of low density quantum dots.

The photonic crystal structure is a regular lattice of regions of a second material within a layer of a first material. There is a defect in the lattice where at least one region of the second material is missing.

Carrier injection in the defect part of the photonic crystal structure electrically excites the quantum emitter, leading to emission of photons. The device may be configured to emit single photons. The device may be configured to emit entangled photon pairs.

In one embodiment, the photonic crystal structure is configured such that the photonic bandgap covers the wavelength of the light emitted from the quantum emitter.

In one embodiment, there is a layer of electrically insulating material overlying and in contact with the photonic crystal structure. A region of a third material in the layer of the electrically insulating material overlies and is in contact with only the defect part of the photonic crystal structure. The third material is electrically conducting and the electrode is electrically contacted to the defect part through the third material. The electrically insulating layer insulates the photonic crystal structure from the electrode, except for the part of the photonic crystal structure in contact with the third material.

In one embodiment, the region of the third material overlies the location of the quantum emitter.

In one embodiment, the width of the photonic crystal structure underlying and in contact with the third material is less than 500 nm, for devices operating in the near-infrared region. In one embodiment, the width of the photonic crystal structure underlying and in contact with the third material is less than 1 µm. In one embodiment, the surface area of the photonic crystal structure underlying and in contact with the third material is less than 500 nm$^2$ for devices operating in the near-infrared region. In one embodiment, the surface area of the photonic crystal structure underlying and in contact with the third material is less than 1 µm$^2$ In one embodiment, a layer comprising a material which is the same as the third material overlies and is in contact with the electrically insulating material and the region of the third material. In one embodiment, the electrode is contacted to this layer.

In one embodiment, the electrically insulating material is the same material as the second material. In one embodiment, the second material has a refractive index of less than 1.6. In one embodiment, the second material is suitable for use as an electron-beam resist. In one embodiment, the second material has a lower refractive index than the first material.

In one embodiment, the second material is hydrogen silsesquioxane.

In one embodiment, the photonic crystal structure is overlying and in contact with a material having a lower refractive index than the first material. In one embodiment, the photonic crystal structure is overlying and in contact with a layer comprising a material which is the same as the second material.

In one embodiment, there is a layer comprising a material which is the same as the second material underlying and in contact with the photonic crystal structure, and overlying and in contact with the photonic crystal structure, and extending through the photonic crystal structure to the layers above and below in the plurality of regions.

In another embodiment, the second material is air. The region below the photonic crystal structure may also be filled with air.

In one embodiment, the plurality of regions of the second material are cylindrical, with the height of the cylinders being in the stacking direction of the layers.

In one embodiment, the lattice is a hexagonal lattice. In one embodiment, the lattice is a square lattice.

In one embodiment, the electrode is a p-type electrode and the optical device has an n-type electrode that is electrically contacted to the opposite surface of the photonic crystal structure to the surface that is electrically contacted to the p-type electrode, forming a p-n junction in a direction substantially perpendicular to the plane of the layers. The opposite surface of the photonic crystal structure may comprise an n-doped layer. The surface of the photonic crystal structure that is contacted to the p-type electrode may comprise a p-doped layer.

In one embodiment, the p-contact to the photonic crystal structure is over the defect part in the stacking direction of the layers and also over the n-type contact.

In one embodiment, the first material is a semiconducting material. The first material may be GaAs. The layer of GaAs may comprise a layer of low density InAs quantum dots. Alternatively, the first material may be InGaP. The layer of InGaP may comprise a layer of low-density InP quantum dots.

In one embodiment, the third material is a metal. In one embodiment, the third material has a lower refractive index than the first material. In one embodiment, the third material has a refractive index of less than 1.6. In one embodiment, the third material is indium tin oxide.

In one embodiment, the photonic crystal structure is part of a mesa on a substrate. The substrate may be GaAs.

In one embodiment, the defect part is a waveguide region along a direction substantially parallel to the plane of the layer. The waveguide region is formed by a plurality of adjacent regions along a line missing from the lattice, forming a linear defect part.

The waveguide may be terminated at a first end by a plurality of regions of the second material configured to form a photonic crystal mirror. The quantum emitter may be located in a first end part of the waveguide. Alternatively, the quantum emitter may be located anywhere along the waveguide region. The waveguide may be terminated at a second end by the edge of the photonic crystal structure. The waveguide may be terminated at a second end by an optical component.

In one embodiment, the photonic crystal structure is a W1 photonic crystal waveguide structure, having a single line of missing regions. The photonic crystal structure may be a W3 photonic crystal waveguide structure or a W5 photonic crystal waveguide structure, or a photonic crystal waveguide structure having a higher number of missing lines.

In one embodiment, the defect part is a cavity region. In one embodiment, the defect is a photonic crystal L3 cavity. Other examples of photonic crystal cavities which can be formed are H1 cavities, L5 cavities and L7 cavities.

In one embodiment, the defect part is a cavity region and the optical device is configured such that light is emitted in the out of plane direction. In one embodiment, there is a region of a third material in a layer of electrically insulating material, which overlies and is in contact with only the defect part of the photonic crystal structure, wherein the third material is electrically conducting and wherein the electrode is electrically contacted to the defect part through the third material. The third material may be transparent to photons emitted from the quantum emitter.

In one embodiment, the device comprises a cavity and a waveguide region which is a second defect part of the lattice formed by a plurality of regions of the second material missing from the lattice; and wherein the waveguide region is optically coupled to the cavity region. The waveguide may be separated from the cavity by one or more regions of the second material.

In one embodiment, the device comprises an interferometer which is a plurality of defect parts of the lattice formed by a plurality of regions of the second material missing from the lattice; and wherein the interferometer is optically coupled to the defect part in which the quantum emitter is located.

The optical device can be extended in order to incorporate several photonic crystal waveguides, cavities, directional couplers and localised injection regions for in-plane single-photon emission to realize more sophisticated architectures that contain several integrated quantum light sources.

According to one embodiment, there is provided a method of fabricating an optical device, comprising the steps of:

forming a sacrificial layer on a substrate;
forming a first electrical contact layer overlying and in contact with the sacrificial layer;
forming a layer of a first material overlying and in contact with the electrical contact layer, the layer of the first material comprising a quantum emitter;
removing a plurality of regions of the layer of the first material, the regions arranged in a regular lattice having at least one region missing from the lattice so that a defect is formed, to form a photonic crystal structure, wherein the quantum emitter is located in the defect part of the photonic crystal structure;
removing a portion of the sacrificial layer;
applying a second material such that it forms a layer overlying and in contact with the photonic crystal structure, wherein the second material is electrically insulating;
removing a region of the layer of the second material, the region overlying the defect part of the photonic crystal structure;
applying a layer of a third material in the region, wherein the third material is electrically conducting;
electrically contacting an electrode third material.

In one embodiment, the layers in the device are grown with molecular beam epitaxy.

In one embodiment, the substrate is GaAs.

In one embodiment, the sacrificial layer is any material that can be selectively etched by wet chemical etching. In one embodiment, the sacrificial layer is AlGaAs.

In one embodiment, the first electrical contact layer is an n-doped layer. In one embodiment, the first electrical contact layer is n-doped GaAs.

In one embodiment, the first material is undoped GaAs having a layer of low density InAs quantum dots. The quantum dot layer may be formed using the Stranski-Krastanov growth mode technique. A p-doped layer may be formed overlying and in contact with the undoped GaAs layer.

In one embodiment, the first electrical contact layer and the layer of a first material are formed into a mesa on the sacrificial layer. The mesa can be formed using photolithography and wet or dry etching.

In one embodiment, the step of removing a plurality of regions of the layer of a first material comprises the steps of: forming a resist on the layer of a first material; transferring a design mask to the resist using lithography; etching through the design mask down to the sacrificial layer.

The step of removing a portion of the sacrificial layer may comprise selectively etching away a portion of the sacrificial layer beneath the photonic crystal structure using wet chemical etching.

The step of applying a layer of a second material may comprise: spin-coating the photonic crystal structure with the second material in a flowable state, such that it fills the space formed by removing a portion of the sacrificial layer and the plurality of regions and forms a layer overlying and in contact with the photonic crystal structure; and thermally treating the device such that the second material hardens.

In one embodiment, the step of removing a region of the layer of the second material comprises: transferring a design mask to the second material using lithography, wherein the second material acts as a resist; and developing the design mask. The development step removes a region of the layer of the second material, exposing a portion of the surface of the defect part of the photonic crystal structure.

In one embodiment, a layer of the third material is formed on the layer of the second material.

A first electrode is contacted to the layer of the third material and a second electrode is contacted to the first electrical contact layer, forming a p-n junction in a direction substantially perpendicular to the stacking direction of the layers.

In one embodiment, the first material is a semiconducting material, the second material is hydrogen silsesquioxane and the third material is indium tin oxide.

FIG. 1 is a schematic illustration of an optical device in accordance with an embodiment. The illustration is a cross section through the layers of the device. Axes labeled x and z are shown in the figure. The z direction is the stacking direction of the layers. The x direction is in the plane of the layers.

The device comprises a photonic crystal slab. A photonic crystal slab has a periodic lattice of regions of a material having a different refractive index to the material of the rest of the slab. A waveguide region is formed by a defect in the lattice, for example where adjacent regions of the material with a different refractive index are omitted, or missing, along a line. The periodic structure of the regions of material having a different refractive index affects the propagation of light in the slab, and forms a photonic bandgap. The defect region creates propagation modes within the bandgap. Light having a wavelength that matches that of one of the propagation modes may propagate along the waveguide region.

The slab also comprises a layer of quantum dots. The device has a p-n junction in a direction perpendicular to the plane of the layers, i.e. in the stacking direction of the layers.

The p-n junction has an electrical contact which is localised to the defect part, in this case the waveguide region, of the photonic crystal slab. The localised electrical contact allows injection of carriers in the waveguide region only. The device thus has only a small current loss and is efficient. Low injection currents may be used due to the funnelling of the carriers into the desired region only.

Depending on the carrier population, the injection of carriers into the quantum dot region results in the creation of excitons or multi-exciton complexes, for example, biexcitons. Due to the atomic-like nature of quantum dots, the radiative recombination of excitons leads to the emission of single and indistinguishable photons. The emission of entangled photon pairs can occur via the radiative biexciton cascade. The injection of two electrons and two holes into the active region with the QD leads to the formation of a biexciton (two electron-hole pairs). Under certain circumstances, the biexciton recombines radiatively emitting a pair of entangled photons. Biexcitons can be created simply by increasing the excitation power, i.e. by increasing the voltage. The device may be used for the electrical generation and in-plane transmission of entangled photon pairs by using suitable architectures based on photonic crystal structures. The photons may be entangled in the polarisation, path or time domain.

The photonic crystal slab is configured such that the photonic bandgap covers the wavelength of the light emitted from a quantum dot. This means that a photon emitted from a quantum dot can propagate laterally along the waveguide region only, when the photon energy lies within the energy range of a propagating mode of the waveguide. There may be photon losses out-of-plane. The lattice structure causes lateral confinement (i.e. confinement in the plane of the layers) in the waveguide region of light emitted from a quantum dot.

The structure of the device shown in FIG. 1 will now be described. The device comprises a substrate 101. The substrate 101 can be any direct band gap semiconductor material. The choice of substrate material may depend on the desired emission wavelength of the light. The electronic bandgap of the material is responsible for the emission and absorption of photons in the material. For example, the substrate material may be any of the III-V semiconductor materials. The substrate material may be an arsenic-based III-V material such as GaAs, InAs or AlGaAs. The electronic bandgap of GaAs makes it suitable for devices in the near-infrared region.

In one embodiment, the substrate 101 is GaAs. In one embodiment, the substrate 101 comprises an undoped GaAs substrate which is of the order of hundreds of microns having a few hundreds of nanometers of n-doped GaAs on top.

There is an AlGaAs layer 103 overlying and in contact with a first portion of the GaAs substrate 101. In the view shown in FIG. 1, the first portion is the left hand portion of the substrate 101. In one embodiment, the thickness of the AlGaAs layer is approximately 900 nm. In one embodiment, the thickness of the AlGaAs layer is between 700 nm and 1000 nm. In one embodiment, the thickness of the AlGaAs layer is greater than 500 nm. In one embodiment, the AlGaAs layer has an aluminium concentration of greater than 60%. In one embodiment, the AlGaAs layer has an aluminium concentration of greater than 70%. AlGaAs having an aluminium content greater than 60% can be etched away using hydrofluoric acid (HF) leaving the rest of the GaAs-based structure intact, forming the slab. Layer 103 can be formed of any material that can be selectively etched by wet chemical etching leading to the formation of a slab.

There is a layer of cured flowable oxide 105 overlying and in contact with a second portion of the GaAs substrate 101. The layer of cured flowable oxide 105 is next to and abuts the AlGaAs layer 103. The cured flowable oxide is an insulating material with low refractive index that can be used as an electron-beam resist, i.e. its chemical bonds can be altered by the absorption of high-energy electrons. The refractive index should be low enough to assure the formation of a photonic bandgap and corresponding propagation modes with the slab material, when patterned with the appropriate geometry to form a photonic crystal waveguide. In one embodiment, the cured flowable oxide is hydrogen silsesquioxane (HSQ). The formula of the HSQ monomer is $H_8Si_8O_{12}$.

There is an n-doped GaAs layer 107 overlying and in contact with the AlGaAs layer 103 and the cured flowable oxide layer 105. In other words, the n-doped GaAs layer 107 extends across the surface of both the AlGaAs layer 103 and the cured flowable oxide layer 105. The thickness of the n-doped GaAs layer 107 is less than the thickness of the AlGaAs layer 103. In one embodiment, the n-doped GaAs layer has a thickness of the order of a few tens of nanometers.

There is an undoped GaAs layer 109 overlying and in contact with a portion of the n-doped GaAs layer 107. The undoped GaAs layer 109 extends over the portion of the n-doped GaAs layer 107 on the cured flowable oxide layer 105 and over part of the portion of the n-doped GaAs layer 107 on the AlGaAs layer 103. The undoped GaAs layer 109 is a mesa structure formed on the AlGaAs and cured flowable oxide. The layer of undoped GaAs 109 has a layer of low-density InAs quantum dots (QDs) in the middle. In other words, the layer of low-density InAs QDs is sandwiched in the undoped GaAs layer 109.

In an alternative embodiment, the device comprises a layer of InGaP comprising a layer of low-density InP quantum dots instead of the undoped GaAs layer 109.

The cured flowable oxide layer 105 extends through the n-doped GaAs layer 107 and the undoped GaAs layer 109 in a plurality of locations, such that the portion of the n-doped GaAs layer 107 and the undoped GaAs layer 109 on the cured flowable oxide layer 105 has a plurality of regions of cured flowable oxide extending through the entire thickness. In an embodiment, the regions are cylindrical. The height of the cylindrical regions of cured flowable oxide extends through the entire thickness of the n-doped GaAs layer 107 and the undoped GaAs layer 109.

The cylindrical regions are arranged as a substantially regular array. The n-doped GaAs layer 107 and the undoped GaAs layer 109, having the regular array of cylindrical regions of a material with a different refractive index (the cured flowable oxide in this case) form a photonic crystal slab. The photonic crystal structure is on a portion of the mesa only. A photonic crystal waveguide slab is further described in relation to FIG. 4 below. The photonic crystal slab is labelled as "slab" in the figure and is sometimes referred to as "the slab". In one embodiment, the cylindrical regions of cured flowable oxide are arranged in a hexagonal lattice. Alternatively, the cylindrical regions may be arranged on a square lattice. A photonic crystal waveguide slab in which the cylindrical regions are arranged in a square lattice is further described in relation to FIG. 12 below. Adjacent cylindrical regions along a line are omitted, or missing, forming a defect in the lattice which is a waveguide region.

The periodic structure of the regions of cured flowable oxide in the slab affects the propagation of light, and forms a photonic bandgap. The light emitted from a quantum dot in the slab falls within this bandgap. Specifically, the cured flowable oxide has a different refractive index to the slab material, GaAs. The periodic change of materials with different refractive index means light having a wavelength within the photonic bandgap can only propagate laterally along the waveguide region. The lattice structure therefore causes lateral confinement (i.e. confinement in the plane of the layers) in the waveguide region of light emitted from a quantum dot in the slab. The difference in the refractive index of the cured flowable oxide and the rest of the slab (which in this case is GaAs) allows for the operation of the photonic crystal structure. In other words, the lattice structure causes light to be laterally confined within a region of the slab, forming a waveguide region.

At least one QD is located in the active region of the slab. The term active region refers generally to the defect part of the lattice of the photonic crystal structure, in this case, the waveguide region. The electrons and holes are injected mostly in the localised region under the p-contact, however, there may be some dispersion of these carriers. The region in which the QD may be located is therefore not limited to being directly under the p contact.

The choice of thickness of the slab depends on the desired emission wavelength of the quantum light. For efficient vertical confinement and in-plane guiding of light, consideration related to the desired emission wavelength can be taken into account in the choice of the slab thickness. In one embodiment, the quantum light source emits in the near-infrared region and the thickness of the slab is approximately 200 nm.

The cured flowable oxide layer 105 extends over the slab such that it is overlying and in contact with the undoped GaAs layer 109. The cured flowable oxide extends across the whole surface of the undoped GaAs layer 109 except for a region which is labelled the injection region 111 in the figure. The injection region is the region through which carriers are injected into the slab. The cured flowable oxide layer insulates the slab from the p-type electrode 113, except for in the small injection region 111.

A layer of material forming a p-type contact is overlying and in contact with the portion of the cured flowable oxide layer 105 that extends over the GaAs layer 109. In one embodiment, the material is indium tin oxide (ITO) 117. In one embodiment, the ITO layer 117 is of the order of several hundreds of nanometers thick. The injection region 111 is also ITO. In other words, the ITO extends down through the cured flowable oxide to the surface of the GaAs layer 109 in a small region, labelled the injection region 111. In one embodiment, the material is metallic.

A p-type electrode is contacted to the surface of the ITO layer 117. A layer of Ti/Au is overlying and in contact with a portion of the ITO layer 117 and a wire is bonded to the Ti/Au, forming the p-type electrode 113. The cured flowable oxide is electrically insulating, meaning that carrier injection occurs only in the small region where the ITO is in contact with the slab.

In an alternative embodiment, the material forming a p-type contact is a thin metal layer. In one embodiment, the p-type contact is of the order of several tens of nanometers thick.

The n-doped GaAs layer 107 at the bottom of the slab provides an n-type contact. A layer of Au/Ge/Ni is overlying and in contact with a portion of the n-doped GaAs layer 107. The portion of the n-doped GaAs layer 107 is above the AlGaAs layer 103 and is a portion on which the undoped GaAs layer 109 is not overlying. A wire is bonded to the Au/Ge/Ni layer, forming the n-type electrode 115.

The p-type electrode and the n-type electrode form a p-n junction parallel to the stacking, or growth, direction of the layers. In other words, the p-n junction is perpendicular to the plane of the layers. In one embodiment, the p-n junction can be reversed, such that the n-type electrode forms a localised contact above the layers. For a reversed p-n junction, a choice of contacts with appropriate working functions for the formation of ohmic contacts at each side of the slab may be used. Furthermore, the n-doped GaAs layer 107 will instead be p-doped.

The exit of the waveguide region, where photons exit the device, is at the right hand edge of the device. The cross-section shown in FIG. 1 does not cut through the waveguide region, but through a part of the photonic crystal structure which is not the waveguide region.

The schematic illustration in FIG. 1 shows the structure of an optical device in accordance with an embodiment. Arsenic-based III-V materials are used as an example. The GaAs photonic crystal slab waveguide 109 containing low-density quantum dots (the layer labelled QDs) in the middle is surrounded by the cured flowable oxide 105. A small region is defined on the surface of the waveguide for carrier injection. The small region is labelled the injection region 111. Top (p-type) and bottom (n-type) contacts are formed by ITO and n-doped GaAs, respectively.

The device may have one or more quantum dots. In either case, a single quantum dot emits each single photon from the device. If there are many QDs in the active region, multi-photon pulses are possible. The device may comprise "site-controlled" quantum dots, where only one quantum dot is located in the active region. Site-controlled QDs are forced to grow at pre-defined sites on the wafer. Alignment techniques can be used to fabricate photonic crystal structures containing only a single QD in the active region. In such a device, the quantum dots are intentionally positioned in the waveguide region by using growth and fabrication methods that provide control over the quantum dot positioning/nucleation.

Semiconductor quantum dots are examples of quantum light sources. The optical device comprises a layer of semiconductor quantum dots, which can emit photons when carriers are injected into the quantum dot layer. The optical device comprises a localised formation electrical contact to the waveguide region. A localised formation electrical contact is an electrical contact formed so that it is localised to the waveguide region of the device. The p-contact to the photonic crystal slab is over the waveguide region in the stacking direction of the layers and also over the n-type contact. The optical device comprises a photonic crystal structure for in-plane light emission, having a p-n junction in a direction parallel to the stacking direction of the layers, with a localised electrical contact. The localised electrical contact allows injection of carriers in the waveguide region rather than outside of the waveguide region.

In a device having large p- and n-type regions contacting the slab, the carriers are more efficiently injected in the region outside of the photonic crystal structure. In other words, in a device having a mesa structure comprising a photonic crystal with a non-localised electrical contact, most of the carriers are injected in the region outside of the photonic crystal. This is because the etched holes can inhibit carrier injection. The device shown in FIG. 1 comprises an insulator (the cured flowable oxide layer) covering the areas of the device outside of the defect part (the waveguide region in this case), to prevent carrier injection in the regions that are not useful. Forming a small contact region on the waveguide allows injection of the carriers in the region of interest, i.e. the waveguiding region.

Figure 2:
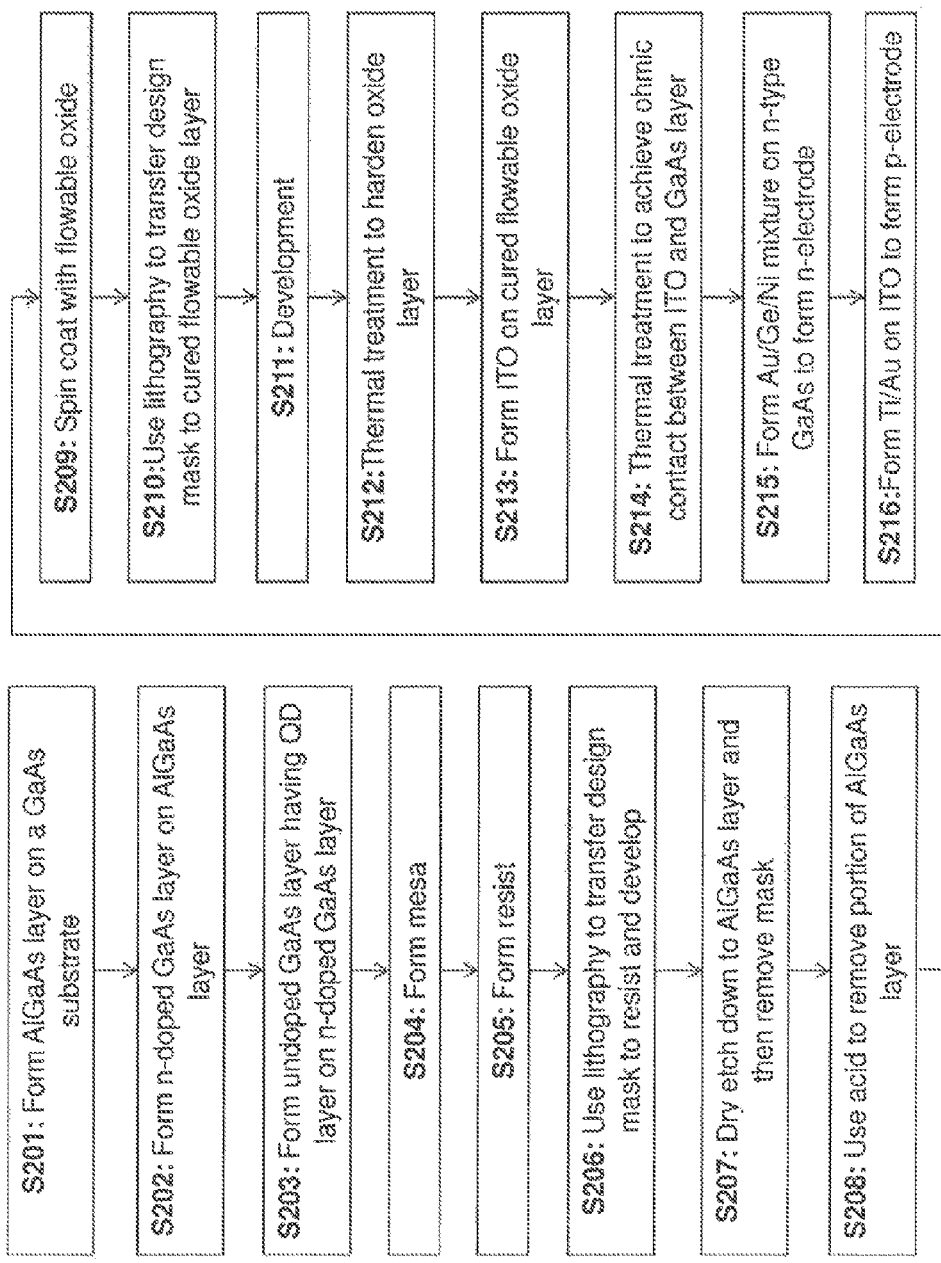
FIG. 2 is a flow chart of a method of fabricating an optical device in accordance with an embodiment.

FIG. 2 is a flow chart of a method of fabricating an optical device in accordance with an embodiment. In this method, a layer structure is formed on a substrate 101 and then processed to form the optical device. The unprocessed structure is grown by epitaxial methods on a suitable substrate 101. The layers are crown using molecular beam epitaxy. The fabrication method described in FIG. 2 fabricates a device having a layer with many quantum dots.

Step S201 is "form AlGaAs layer on a GaAs substrate". An AlGaAs layer 301 is grown on a GaAs 101 substrate. The AlGaAs layer 301 is grown on top of the GaAs substrate 101, extending across the whole surface of the substrate 101.

Step S202 is "form n-doped GaAs layer on AlGaAs layer". An n-doped GaAs layer 303 is grown on the AlGaAs layer 301.

Step S203 is "form undoped GaAs layer having QD layer on n-doped GaAs layer". A layer of undoped GaAs 305 is grown on the n-doped GaAs layer 303, with a layer of low-density InAs quantum dots (QDs) grown in the middle of the undoped GaAs layer 305.

In one embodiment, a Stranski-Krastanov growth mode technique is used to form the QDs. After the n-doped GaAs layer 303 has been grown, the growth of the undoped GaAs 305 is started. At the mid-point of the growth of the undoped GaAs layer 305, the growth is stopped and a thin layer of InAs is deposited. In other words, once the undoped GaAs layer 305 has been grown to half of the desired thickness, the growth of the undoped GaAs is stopped and a thin layer of InAs is deposited. The remaining undoped GaAs is then deposited. There is a strain-induced formation of QDs in the InAs layer. Other methods of forming the QDs can be used.

Figure 3A:
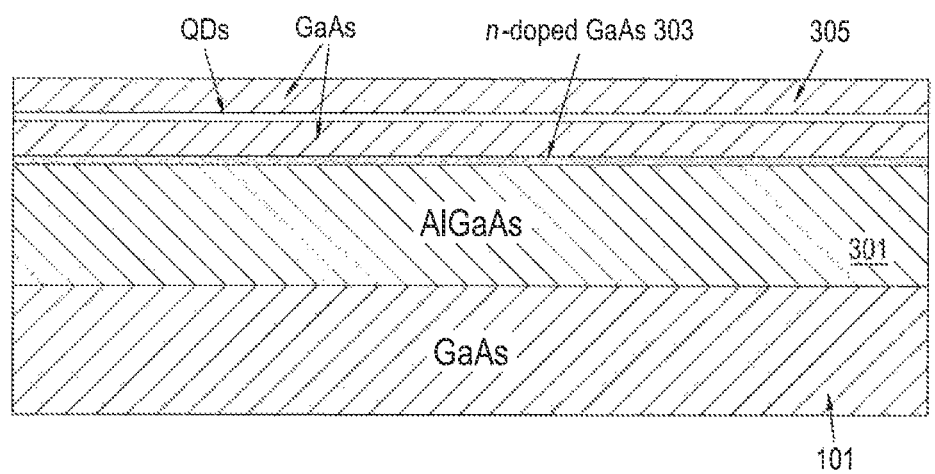
FIG. 3(a) is a schematic illustration of a fabrication stage in the fabrication of a device in accordance with an embodiment.

A schematic illustration of the resultant layered structure obtained after steps S201 to S203 is shown in FIG. 3(a). This structure is the unprocessed structure.

Step S204 is "form mesa". In this step, lithography and wet etching down to the thin n-doped GaAs layer 303 is used to define one or more mesas that will contain the photonic crystal device. In one embodiment, one or more mesas with dimensions of several micrometers, for example, having dimensions of 50×50 μm, are defined using standard photolithography and etching techniques. The mesas define the regions where the vertical p-i-n diode is created and will host the photonic crystal structures. The step of forming the mesa involves several stages. Firstly, a positive photo-resist, for example, Microposit™ S1813™, is spun on top of the wafer. In one embodiment, the thickness of the resist is of the order of several hundred nanometers. The next step is UV exposure and development, for example using MF319™ developer for a S1813™ resist. During development the exposed areas of the resist, i.e. the surroundings of the mesa regions, are removed. These regions are then etched using wet or dry etching. For wet etching of GaAs-based mesas, a mixture of $H_2SO_4$—$H_2O_2$—$H_2O$ (sulfuric acid-hydrogen peroxide-water) can be used. For dry etching, a plasma based on silicon tetrachloride or chlorine gas can be used. The etching depth is defined by the thickness of the slab, i.e. the distance from the top of the un-doped GaAs layer 305 to the top of the n-doped GaAs layer 303. The etching is stopped when the n-doped GaAs layer 303 is reached.

Figure 3B:
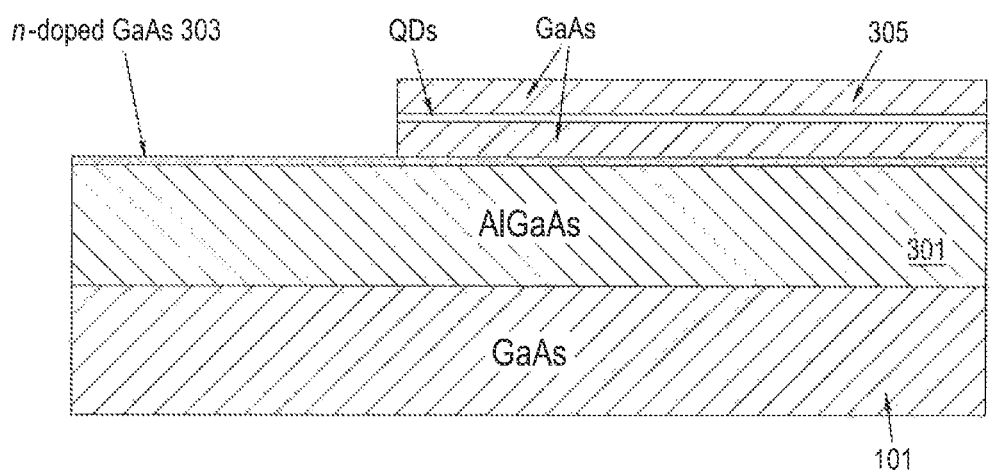
FIG. 3(b) is a schematic illustration of a fabrication stage in the fabrication of a device in accordance with an embodiment.

A schematic illustration of the structure obtained after step S204 is shown in FIG. 3(b).

Figure 3C:
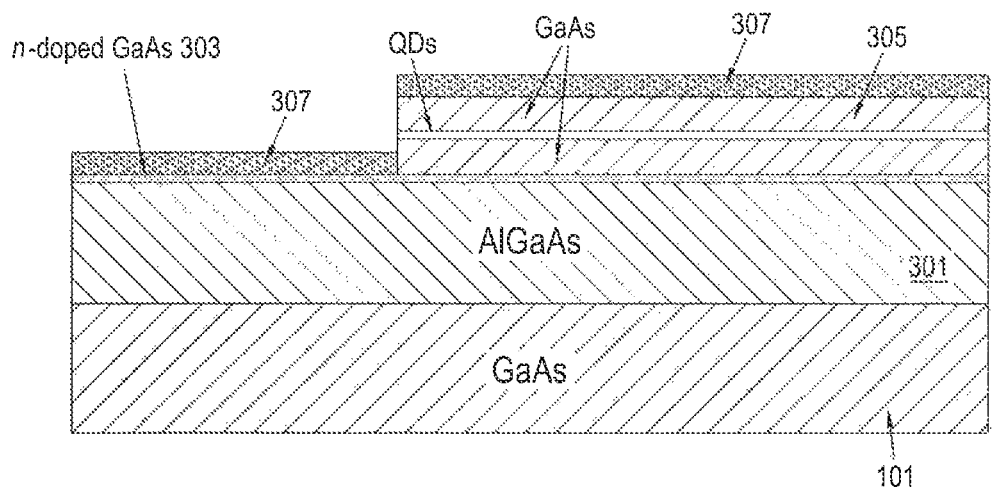
FIG. 3(c) is a schematic illustration of a fabrication stage in the fabrication of a device in accordance with an embodiment.

Step S205 is "form resist". A schematic illustration of the layered structure with an electron beam resist 307 formed on top is shown in FIG. 3(c). A thin layer of electron beam resist 307 is deposited on top of the structure. An electron beam resist is a material for which the chemical bonds can be altered by the absorption of high-energy electrons.

Figure 3D:
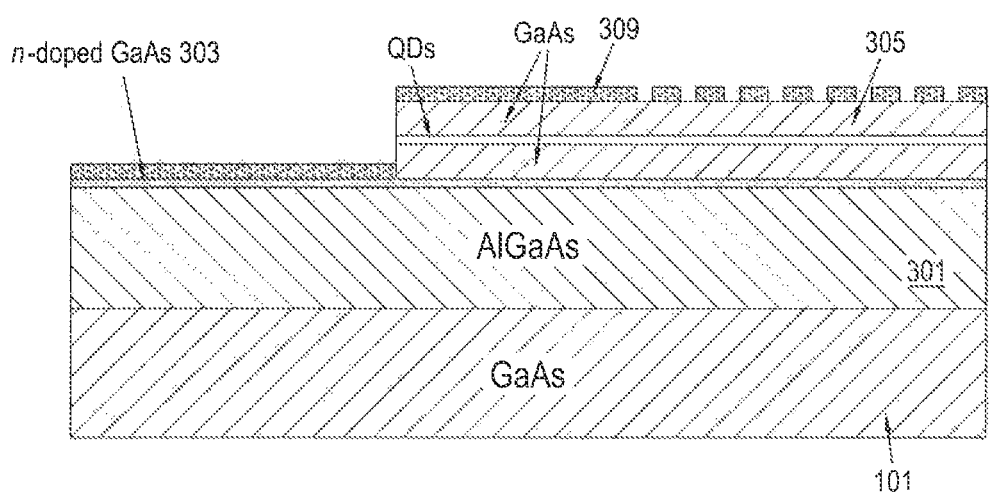
FIG. 3(d) is a schematic illustration of a fabrication stage in the fabrication of a device in accordance with an embodiment.

Step S206 is "use lithography to transfer design mask to resist and develop". A design mask 309 is transferred to the thin layer of electron-beam resist 307 by electron-beam lithography. The design mask 309 is then developed by using an appropriate chemical to remove the regions of the resist (the holes) that have been exposed to the electron beam. A schematic illustration of the layered structure having the design mask 309 on the surface of the undoped GaAs layer 305 is shown in FIG. 3(d). In one embodiment, the design mask 309 has a regular lattice of circular holes. In one embodiment, adjacent holes along a line are omitted, or missing, forming a defect part of the lattice which is a waveguide region. Alternatively, one or more holes may be omitted, or missing, forming a defect part of the lattice which is a cavity region. Examples of some configurations of the defect parts of the lattice are described in relation to FIG. 4 and FIGS. 13 to 15 below.

Alternatively, other techniques such as photolithography using a photoresist could be used to transfer the mask. In one embodiment, photolithography may be used to transfer the mask when larger structures need to be fabricated, i.e. structures of the order of greater than 1 micrometer.

Step S207 is "dry etch down to AlGaAs layer and then remove mask". In this step, dry etching is used to etch the design into the device through the lithography mask. In one embodiment, Reactive Ion Etching can be used. In one embodiment, Inductively Coupled Plasma Reactive Ion Etching can be used. In both cases, ions from a mixture of suitable gases are accelerated by high voltage and bombard the sample with high energies, etching the regions that are not covered, i.e. not protected, by the resist. Both mechanical and chemical etching occurs. The type of gases used depends on the material to be etched and the apparatus used. Gases having silicon tetrachloride-based chemistry or chlorine-based chemistry can be used for etching GaAs.

Figure 3E:
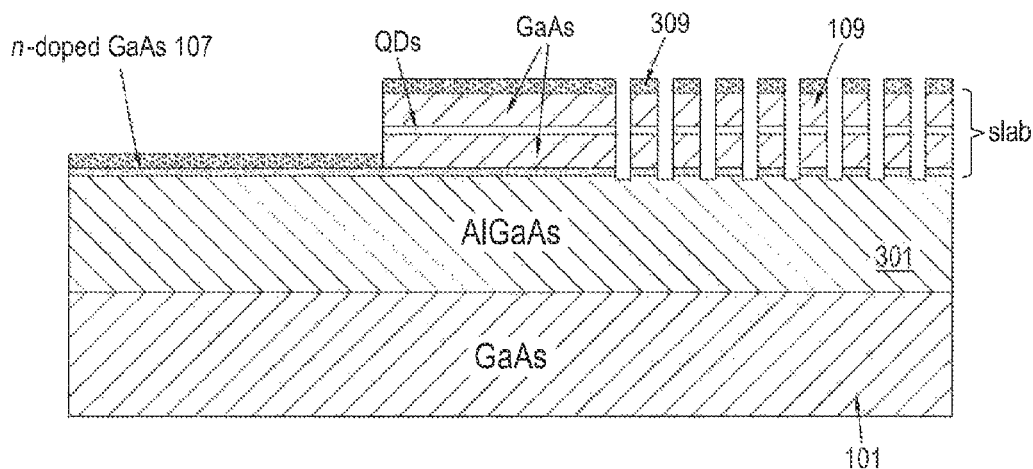
FIG. 3(e) is a schematic illustration of a fabrication stage in the fabrication of a device in accordance with an embodiment.

The dry etching depth is net to be just over the thickness of the undoped GaAs layer 109 and n-doped GaAs layer 107, in order to reach the AlGaAs layer 301. The etching forms the photonic crystal waveguide slab. A photonic crystal waveguide slab is further described in relation to FIG. 4 below. The layer on which the slab is formed (in this case the AlGaAs layer 301) is referred to as a sacrificial layer. A schematic illustration of the layered structure after the dry etching has been performed is shown in FIG. 3(e). Where the design mask 309 has a regular lattice of circular holes, the dry etching process etches a regular lattice of cylindrical holes into the undoped GaAs layer 109 and n-doped GaAs layer 107. In one embodiment, adjacent regions along a line in the lattice are omitted, or missing, forming a waveguide structure. The mask is then removed chemically by a resist-stripper.

Alternatively, a wet etching technique can be used to etch the design through the mask. For wet etching, a mixture of H2SO4-H2O2-H2O (sulfuric acid-hydrogen peroxide-water) can be used.

Step S208 is "use acid to remove portion of AlGaAs layer". A portion of the sacrificial layer underneath the slab is removed using acid etching. Where the sacrificial layer is AlGaAs, a low-concentration solution of hydrofluoric acid is used for the removal of the sacrificial layer. AlGaAs having an aluminium content greater than 60% can be etched away using hydrofluoric acid (HF), leaving the rest of the GaAs-based structure intact. The low-concentration hydrofluoric acid removes, or etches, the AlGaAs while leaving the GaAs intact. The HF solution does not affect the GaAs. To perform the etching, the device is immersed in the HF solution. The device is left in the HF solution for an amount of time such that only the part of the AlGaAs layer underneath the photonic crystal structure is removed, and not the whole AlGaAs layer. For example, only the part of the AlGaAs layer on the right hand side of the figure is removed in FIG. 3(e). The HF enters from the etched holes, and therefore removes the AlGaAs layer underlying the holes first.

The sacrificial layer can alternatively be any material that can be selectively etched by wet chemical etching leading to the formation of a slab. Other appropriate acid solutions can be used for different material removal.

Figure 3F:
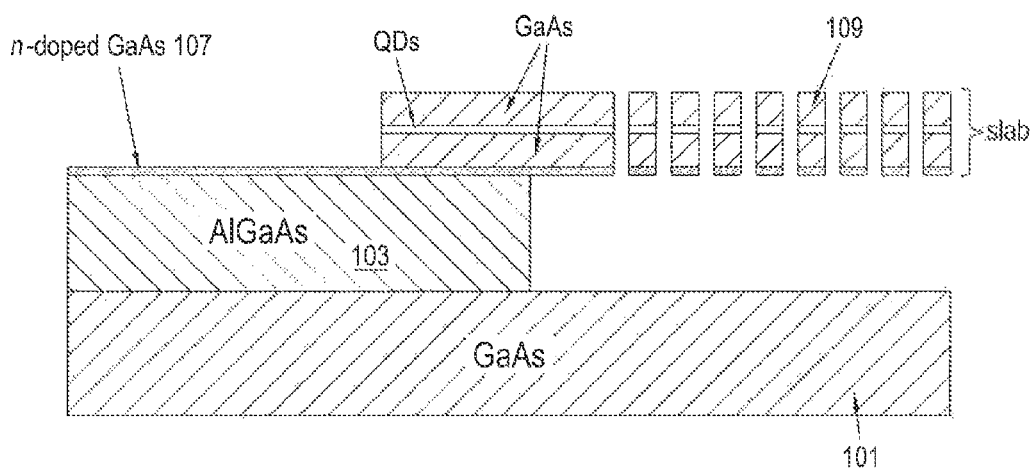
FIG. 3(f) is a schematic illustration of a fabrication stage in the fabrication of a device in accordance with an embodiment.

A schematic illustration of the layered structure after a portion of the sacrificial layer has been removed is shown in FIG. 3(f). The sacrificial layer is removed in order that a material with low refractive index can be formed on each side (in the stacking direction of the layers) of the photonic crystal slab. In the final device, for example, HSQ may border the slab in one direction and ITO in the other. Both have low refractive indexes (HSQ≈1.4, ITO~1.75 at 900 nm). The refractive indexes considered are for the near-infrared region in this case.

Figure 3G:
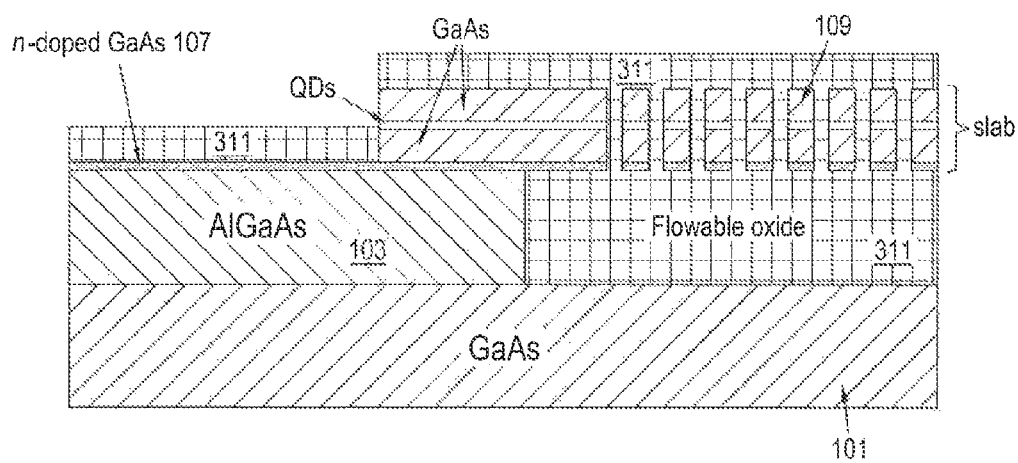
FIG. 3(g) is a schematic illustration of a fabrication stage in the fabrication of a device in accordance with an embodiment.

Step S209 is "spin coat with flowable oxide". In order to achieve localised carrier injection, the photonic crystal structure is spin coated with a thin layer of flowable oxide 311, for example, a solution of hydrogen silsesquioxane (HSQ). This layer has two functions: firstly it provides insulation between the top p-electrode 113 and the slab; secondly, it serves as an electron-beam resist. A schematic illustration of the layered structure after spin coating with the flowable oxide 105 is shown in FIG. 3(g). The flowable oxide forms a layer on the surface of the slab. The flowable oxide 105 also fills the space where the sacrificial layer was removed in step S208, and also fills the cylindrical regions which were dry etched away in step S207.

In this embodiment, when the flowable oxide is provided on top of the slab (in order to provide partial insulation and definition of the small region for the p-contact) the holes in the photonic crystal slab are also filled with the flowable oxide. The filling of the holes with the flowable oxide occurs as a result of the process used to provide insulation on top of the slab. However, since the refractive index of the flowable oxide material is small, the filling of the cylindrical regions in the photonic crystal slab with the flowable oxide does not prevent the operation of the photonic crystal device.

Figure 3H:
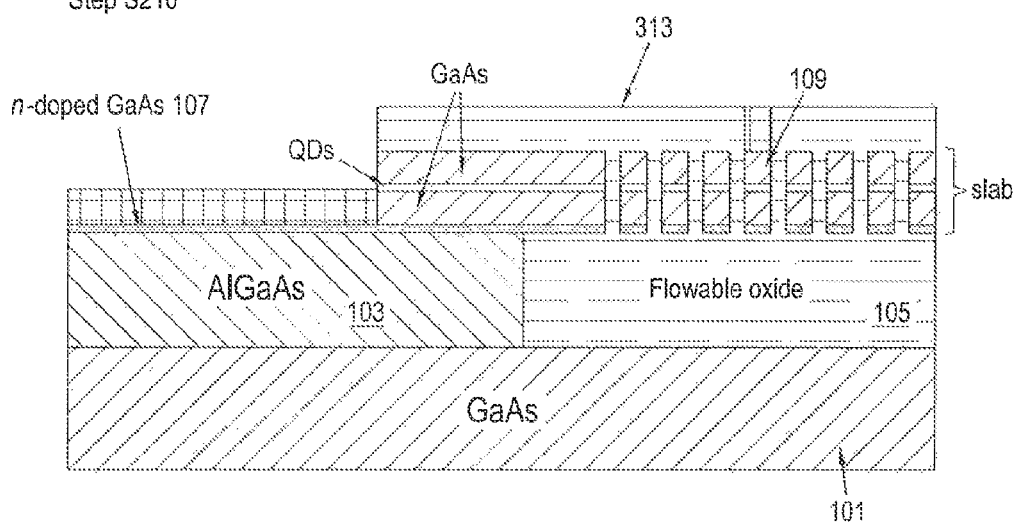
FIG. 3(h) is a schematic illustration of a fabrication stage in the fabrication of a device in accordance with an embodiment.

Step S210 is "use lithography to transfer design mask to flowable oxide layer". The flowable oxide layer 105 serves as an electron beam resist. A design mask 313 is transferred to the flowable oxide layer 105 by electron-beam lithography. A schematic illustration of the layered structure after the design mask has been transferred is shown in FIG. 3(h). The darker region of the flowable oxide in FIG. 3(h) indicates the regions of the flowable oxide which have been written by the electron beam. A small region in contact with the defect part of the photonic crystal slab is not written by the electron beam. The region of the flowable oxide overlying and in contact with the n-doped GaAs layer 107 is not written by the electron beam.

Step S211 is "development". The HSQ regions that are not written by the electron beam (which will correspond to the localised injection region and the region overlying and in contact with the n-doped GaAs layer 107) are removed during the development process. The non-written HSQ regions are washed away during the development. In other words, the lighter regions of the flowable oxide in FIG. 3(h), including the injection region, are removed with the development. This creates a localised "gap" through the flowable oxide down to the surface of the slab at the defect part of the slab. In other words, the whole top of the mesa is written by the electron beam, except for the small injection region. Steps S209 and S210 may comprise HSQ spin coating, baking, electron beam exposure and development. The development process removes a region of the flowable oxide 105, exposing a portion of a surface of the slab.

Regions under the GaAs slab and within the etched cylinders may not be written by electron-beam lithography, but during the development process they will be protected by the written regions of the flowable oxide which are over the top.

This step can define with great accuracy the regions in which carrier injection will be provided. For an in-plane quantum light source, carrier injection in the waveguide region of the photonic crystal waveguide electrically excites the quantum dots. Using electron-beam lithography and subsequent resist development allows regions to be defined where the insulating cured flowable oxide layer 105 is removed. The p-type electrode will have direct electrical contact with the top surface of the photonic crystal slab in these regions. This results in efficient injection of carriers in the desired location. In one embodiment, the size of these regions is of the order of a few hundred nanometers.

Figure 3I:
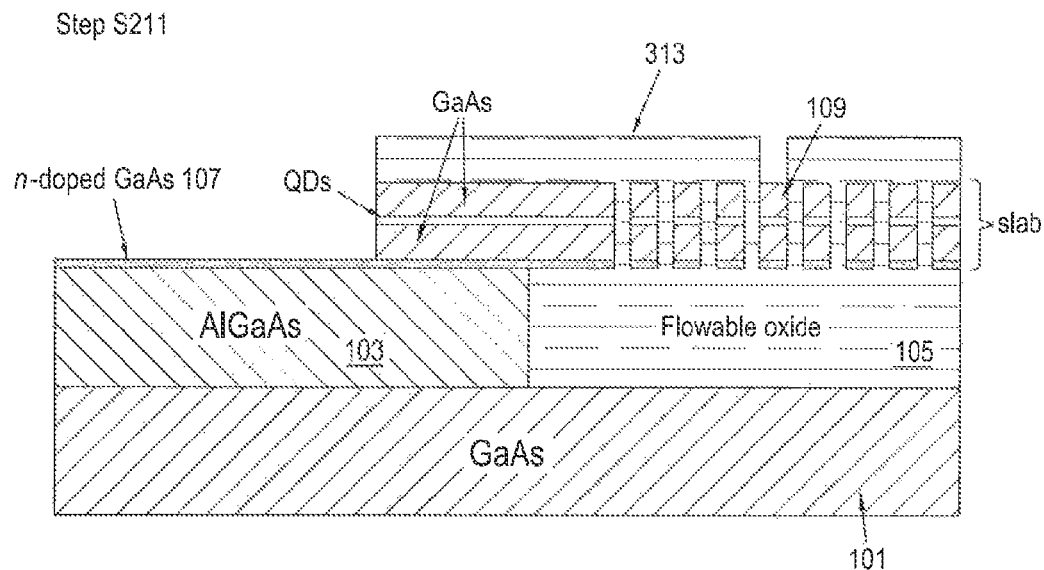
FIG. 3(i) is a schematic illustration of a fabrication stage in the fabrication of a device in accordance with an embodiment.

A schematic illustration of the layered structure after development is shown in FIG. 3(i).

Step S212 is "thermal treatment to harden oxide layer". The device is thermally treated such that the flowable oxide layer hardens, and becomes solid and not flowable. After thermal treatment it is referred to as the cured flowable oxide layer 105. The curing improves the dielectric properties of HSQ.

Figure 3J:
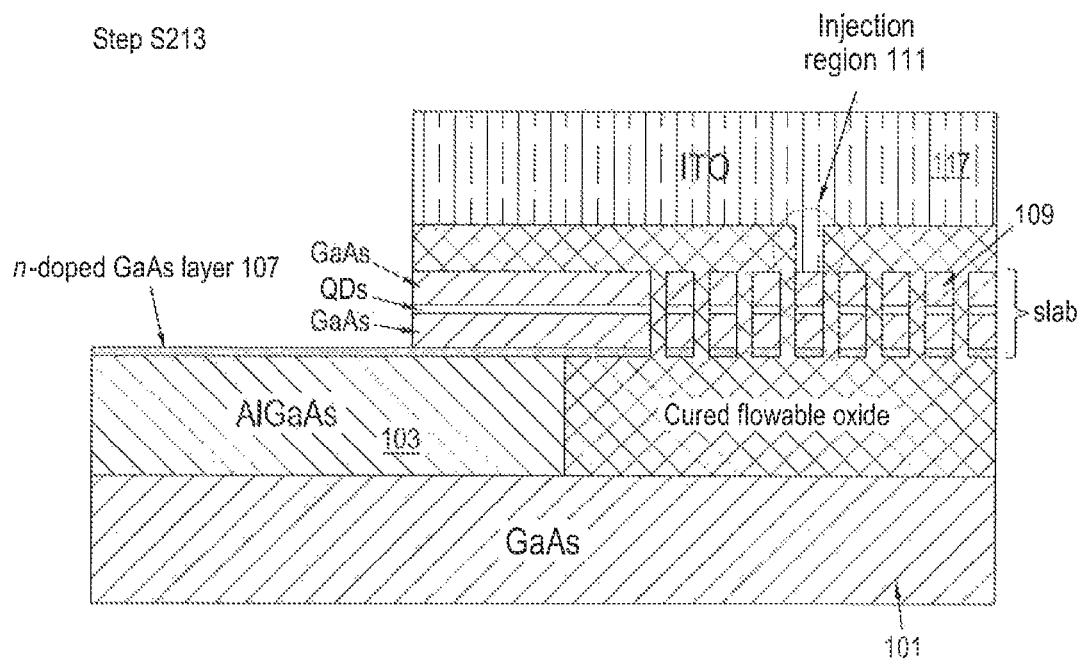
FIG. 3(j) is a schematic illustration of a fabrication stage in the fabrication of a device in accordance with an embodiment.

Step S213 is "form ITO on cured flowable oxide layer". The top, p-type contact can be any material that can form an ohmic contact when in contact with the slab material and can be deposited. For example, a layer of indium tin oxide (ITO) 117 can be deposited on top of the cured flowable oxide 105 layer and extending through the injection region to the slab, forming a p-type contact to the slab. ITO is grown directly on the GaAs slab in the areas that have been defined by the electron beam lithography (in step S210) and removed in development (in step S211). The ITO layer 117 serves as the top, p-electrode. A schematic illustration of the layered structure after growth of the ITO is shown in FIG. 3(j).

Step S214 is "thermal treatment to achieve ohmic contact between ITO and GaAs layer". Thermal treatment at moderate temperatures can be used to achieve good ohmic contact between the ITO and GaAs. In one embodiment, the device is treated at around 400-500 degrees Celsius for around 30 to 60 seconds in order to form an ohmic contact between the slab and the ITO.

Figure 3K:
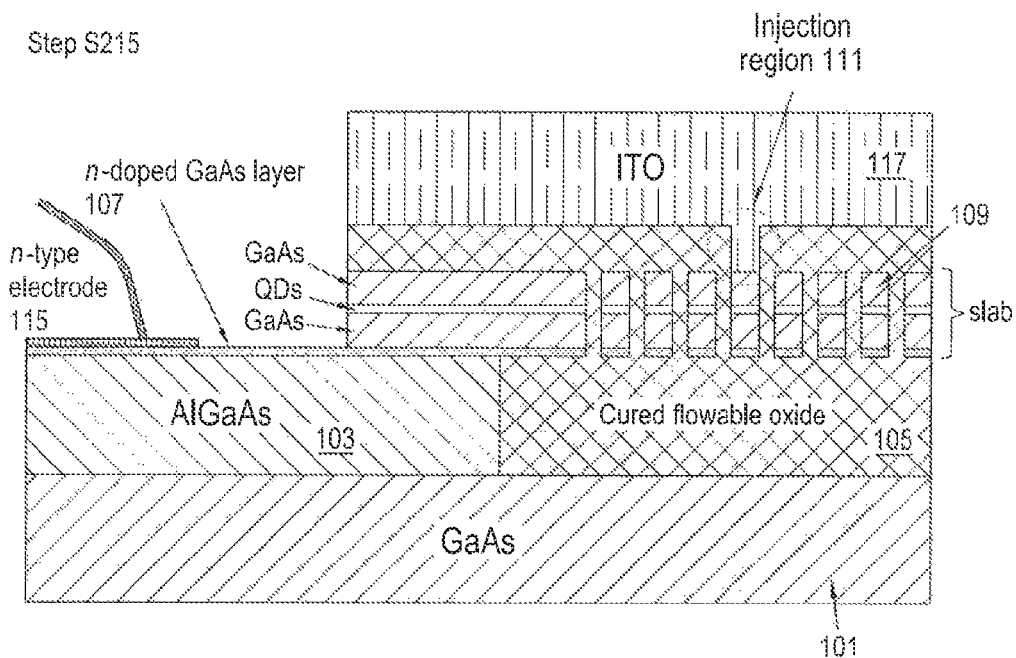
FIG. 3(k) is a schematic illustration of a fabrication stage in the fabrication of a device in accordance with an embodiment.
Figure 3L:
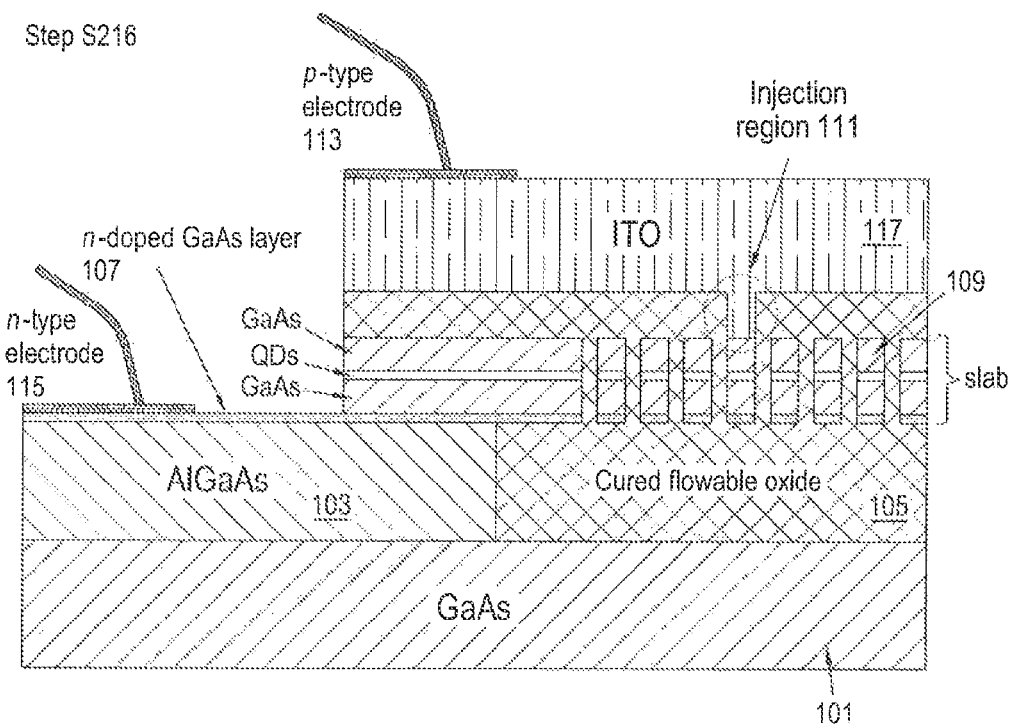
FIG. 3(l) is a schematic illustration of a fabrication stage in the fabrication of a device in accordance with an embodiment.

Step S215 is "form Au/Ge/Ni mixture on n-type GaAs to form n-electrode". The Au/Ge/Ni mixture is a mixture or alloy of these materials. A layer of the Au/Ge/Ni mixture is deposited on the n-type GaAs layer 107 using the lithography and liftoff process. The Au/Ge/Ni mixture is then used for the formation and bonding of the n-type bottom contact. A wire is than bonded to the Au/Ge/Ni mixture layer. In one embodiment, the contact is formed after annealing at around 420 degrees Celsius for a few tens of seconds. This forms the n-type electrode 115. A schematic illustration of the device after the addition of the n-type electrode 115 is shown in FIG. 3(k).

Step S216 is "form Ti/Au on ITO to form p-electrode". A layer of Ti/Au alloy is deposited on a portion of the ITO surface by lithography and liftoff processes. In this process, a resist is spun across the entire structure. The regions on which the Ti/Au alloy is to be deposited are then exposed. The resist is then developed to remove the resist in these regions. Ti/Au is then evaporated across the entire structure and then the regions of the resist that were not exposed are removed (which removes the metal on top of the regions too). This leaves Ti/Au in the desired regions only.

A wire is then bonded to the Ti/Au layer. This forms the p-type electrode 113. A schematic illustration of the device after thermal treatment and with the addition of the p-type electrode is shown in FIG. 3(*i*).

The n-type contact (Au/Ge/Ni) is deposited first and then thermally treated, or annealed. The p-type contact (Ti/Au) is then formed without any thermal treatment. Ti/Au cannot withstand the high temperature annealing needed for the Au/Ge/Ni.

For a reversed junction structure with a p-type GaAs layer on the bottom of the slab and an n-type layer on the top of the slab, the n-type contact (Au/Ge/Ni) should still be formed and thermally treated before the p-type contact is formed.

Figure 4:
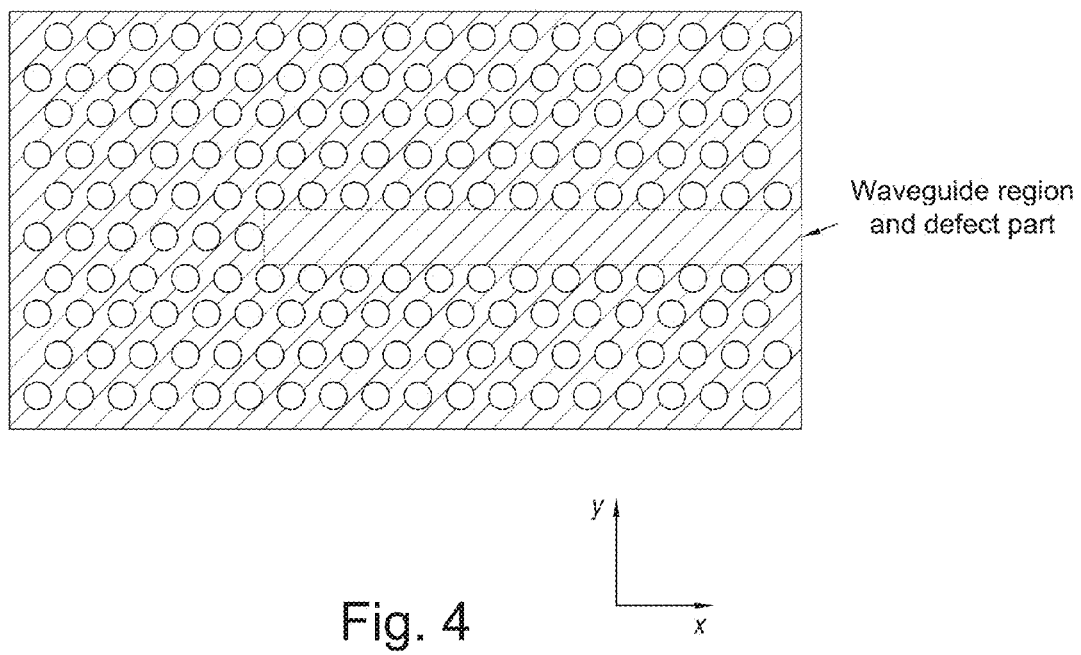
FIG. 4 is a schematic illustration of a unidirectional W1 photonic crystal waveguide slab which forms part of an optical device in accordance with an embodiment.

FIG. 4 shows a schematic illustration of a unidirectional W1 photonic crystal waveguide slab which forms part of an optical device in accordance with an embodiment. A W1 photonic crystal structure has a single line of missing holes. Other types of waveguide structure include W3 and W5, which have more missing lines. These structures will have larger waveguide regions.

The slab in FIG. 4 is seen from above. i.e. looking down the stacking direction of the layers. Axes labelled y and x are shown in the figure. The x and y directions are orthogonal to each other and are both in the plane of the layers. The slab is a two dimensional photonic crystal waveguide. The photonic crystal waveguide slab can be fabricated using nanofabrication techniques, for example as described in relation to FIG. 2.

A photonic crystal slab can be either bidirectional or unidirectional. The slab shown in FIG. 4 is unidirectional. A unidirectional slab allows for increased emission efficiency towards the desired direction.

The slab comprises a substantially regular array of substantially cylindrical holes. In the slab shown in FIG. 4, the holes are arranged on a hexagonal lattice. The holes may be arranged on an alternative lattice, for example a square lattice. The waveguide structure is achieved by the omission of one or more lines of holes along a specific direction in the lattice. In other words, the waveguide is formed by adjacent holes along a line being omitted or missing. The waveguide is terminated at one end by the edge of the slab and at the other end by a line of holes. Additionally, holes may be shifted from their lattice position in order to form the waveguide. The waveguide region is indicated with the dotted line boundary and the label waveguide region. Several waveguides may be included in a single slab.

The periodic structure of the holes in the slab affects the propagation of light. The holes have a different refractive index to the slab material. The periodic change of materials with different refractive index (holes and slab material) generates a region on the energy spectrum, known as the photonic bandgap, where light cannot propagate in certain directions. The photonic bandgap is a band of wavelengths. Light having a wavelength within this band cannot propagate in certain directions in the lattice. The waveguide induces propagation modes within the photonic bandgap. Light with certain polarisation and wavelength that matches one of the propagation modes can propagate efficiently along the waveguide. The parameters that influence the energy spectrum covered by the photonic bandgap are the photonic crystal lattice constant, a, (i.e. the spacing between the centres of two adjacent holes) and hole radius, r. In order to determine these parameters, calculations based on electromagnetism theory are performed. This can be performed by commercial software.

The lattice structure causes lateral confinement (i.e. confinement in the plane of the layers) of the light in the waveguide region.

FIG. 5(*a*) is the same schematic illustration of a photonic crystal slab shown in FIG. 4. Lines have been added to the slab, showing the lines along which cross-sections of the slab are shown in FIGS. 5(*b*) to 5(*e*) and FIGS. 6(*a*) to 6(*c*). The line B:B is along the x direction in a region which is not the waveguide region. Line C:C is along the x direction in the waveguide region. Lines D:D and E:E are both along the y direction and run through the waveguide region. The n-doped GaAs layer 107 is not shown in the cross sections of the slab. Only the undoped GaAs layer having a layer of QDs is shown.

FIG. 5(*b*) is a schematic illustration of a cross section of the photonic crystal slab along the line B:B. The holes extend through the entire thickness of the slab and are cylindrical in shape. The QD layer is sandwiched in the middle of the GaAs slab. Axes labelled z and x are also shown in the figure. The z direction is the stacking direction of the layers. The x direction is in the plane of the layers. The x direction is orthogonal to the z direction. The cylindrical holes extend along the z direction (i.e. so that the length of the cylinder is in the z direction).

FIG. 5(*c*) is a schematic illustration of a cross section of the photonic crystal slab along the line C:C. Again, the holes extend through the entire thickness of the slab and are cylindrical in shape. The QD layer is sandwiched in the middle of the GaAs slab. The axes labelled z and x are also shown in the figure.

The waveguide region is the solid portion of the slab without any holes. The waveguide runs along the x direction, therefore the entire length, L, of the waveguide can be seen in the figure. Light emitted from the quantum dot layer in the waveguide region propagates along the waveguide region in the x direction because of the lateral confinement provided by the regular lattice structure.

FIG. 5(*d*) is a schematic illustration of a cross section of the photonic crystal slab along the line D:D. Again, the holes extend through the entire thickness of the slab and are cylindrical in shape. The QD layer is sandwiched in the middle of the GaAs slab. Axes labelled z and y are also shown in the figure. The z direction is the stacking direction of the layers. The y direction is in the plane of the layers. The z direction and y direction are orthogonal to each other. The cylindrical holes extend along the z direction (i.e. no that the length of the cylinder is in the z direction). As this cross section is along the y direction, it cuts across the waveguide region. The width, W, of the waveguide region can be seen in the figure.

FIG. 5(*e*) is a schematic illustration of a cross section of the photonic crystal slab along the line E:E. Again, the holes extend through the entire thickness of the slab and are cylindrical in shape. The axes labelled z and y are also shown in the figure. As this cross section is also along the y direction, it also cuts across the waveguide region. The width, W, of the waveguide region can be seen in the figure.

FIG. 6(*a*) is the same cross section shown in FIG. 5(*c*), with the cured flowable oxide layer 105 and the ITO region 111 of the optical device also shown. The cured flowable oxide layer is overlying the surface of the slab and extends through the cylindrical holes in the slab and below the slab. A region of ITO is overlying and in contact with the surface of the waveguide region of the slab. In an embodiment, the ITO contacts only a portion of the length L of the waveguide region. The ITO is only in contact with the GaAs in the localised "injection region". The ITO extends over the whole structure above the HSQ however. The region of ITO is the injection region 111. The injection region 111 is a localised p-type contact that contacts only the waveguide portion of the slab. When a forward bias is applied across the p-n junction, carriers are injected into the waveguide region of the slab. The injection of electrons and holes in the quantum dot layer in the waveguide region results in the creation of excitons in the quantum dot. The radiative recombination of excitons leads to the emission of photons into the waveguide region. The photons propagate along the waveguide region only. Because the p contact is localised to the waveguide region, carriers are injected more efficiently in the waveguide region, and thus photons are emitted in the waveguide region of the slab.

Vertical confinement of the light in the waveguide is caused by the materials above and below the waveguide having a different refractive index to the slab material. The refractive index of the cured flowable oxide and ITO is lower than that of the slab material. The propagating optical mode is vertically confined by the difference in refractive index between the waveguide material and the material above and below the waveguide.

Figure 5A:
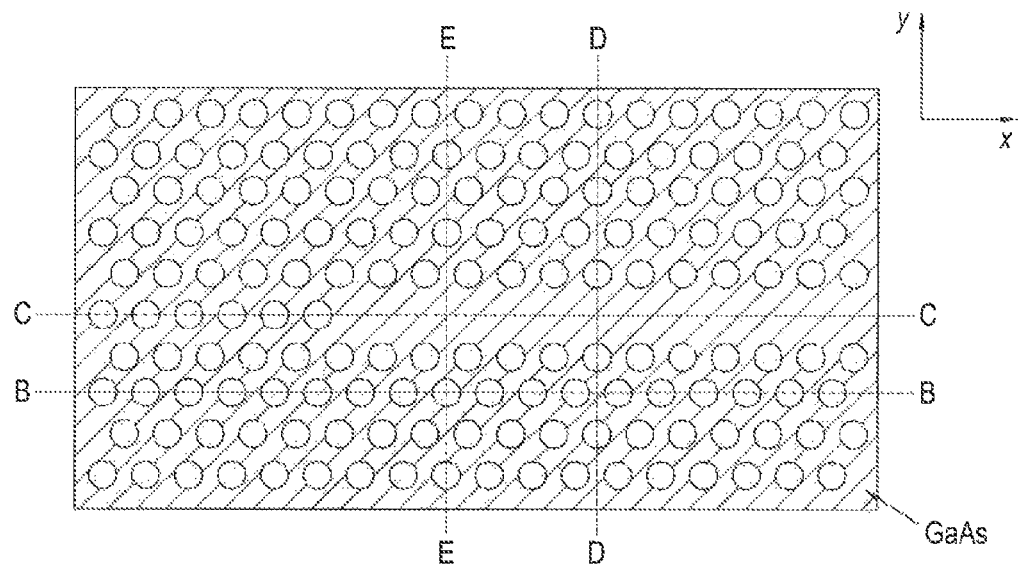
FIG. 5(a) is the same schematic illustration of a photonic crystal slab shown in FIG. 4, showing the lines along which cross-sections of the slab are shown in FIGS. 5(b) to 5(e) and FIGS. 6(a) to 6(c)
Figure 5B:
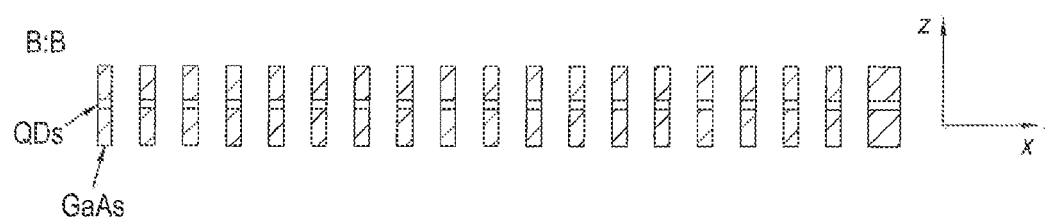
FIG. 5(b) is a schematic illustration of a cross-section of the photonic crystal slab through line B:B of FIG. 5(a)
Figure 5C:
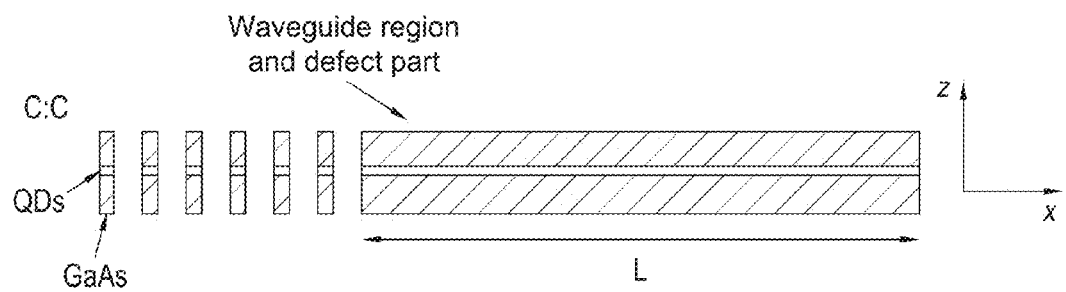
FIG. 5(c) is a schematic illustration of a cross-section of the photonic crystal slab through line C:C of FIG. 5(a)
Figure 5D:
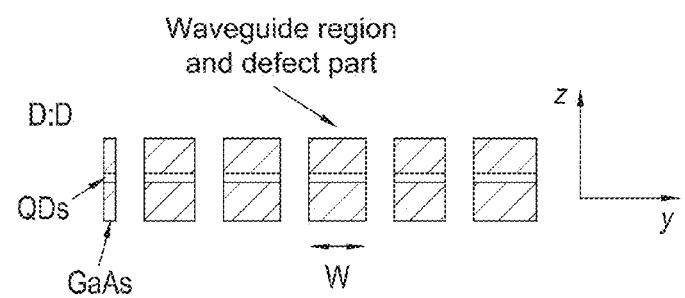
FIG. 5(d) is a schematic illustration of a cross-section of the photonic crystal slab through line D:D of FIG. 5(a)
Figure 6A:
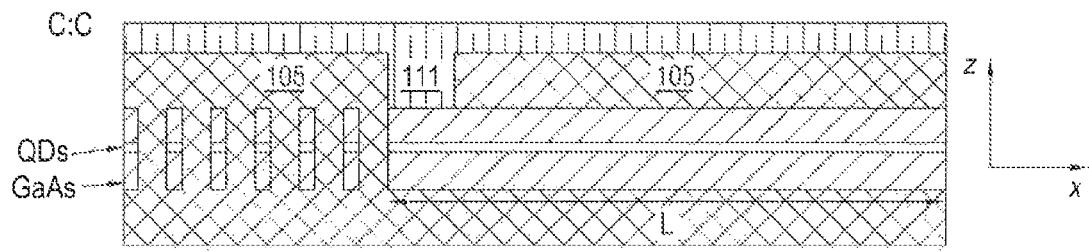
FIG. 6(a) is a schematic illustration of a cross-section of the photonic crystal slab and a portion of the flowable oxide and ITO layers of the device shown in FIG. 1, through line C:C of FIG. 5(a)
Figure 6B:
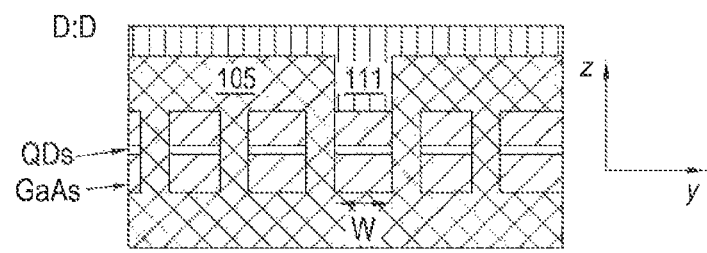
FIG. 6(b) is a schematic illustration of a cross-section of the photonic crystal slab and a portion of the flowable oxide and ITO layers of the device shown in FIG. 1, through line D:D of FIG. 5(a)

FIG. 6(b) is the same cross section shown in FIG. 5(d), with the cured flowable oxide layer 105 and the ITO region 111 of the optical device also shown. The cured flowable oxide layer overlies the surface of the slab and extends through the cylindrical holes in the slab and below the slab. A region of ITO is overlying and in contact with the surface of the waveguide region of the slab.

Figure 5E:
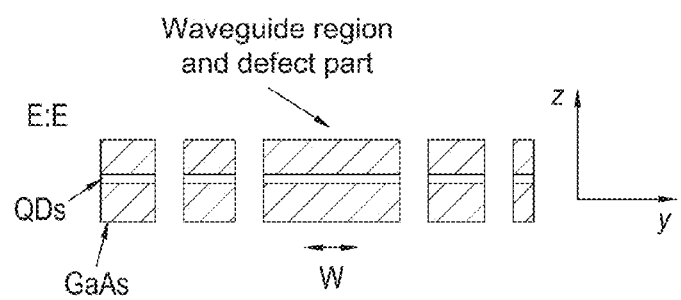
FIG. 5(e) is a schematic illustration of a cross-section of the photonic crystal slab through line E:E of FIG. 5(a)
Figure 6C:
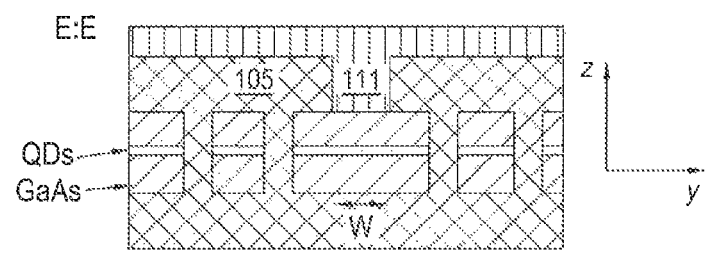
FIG. 6(c) is a schematic illustration of a cross-section of the photonic crystal slab and a portion of the flowable oxide and ITO layers of the device shown in FIG. 1, through line E:E of FIG. 5(a)

FIG. 6(c) is the same cross section shown in FIG. 5(e), with the cured flowable oxide layer 105 and the ITO region 111 of the optical device also shown. The cured flowable oxide layer is on top of the slab and extends through the cylindrical holes in the slab and below the slab. A region of ITO is overlying and in contact with the surface of the waveguide region of the slab. The ITO extends across the entire width W of the waveguide region.

Figure 6D:
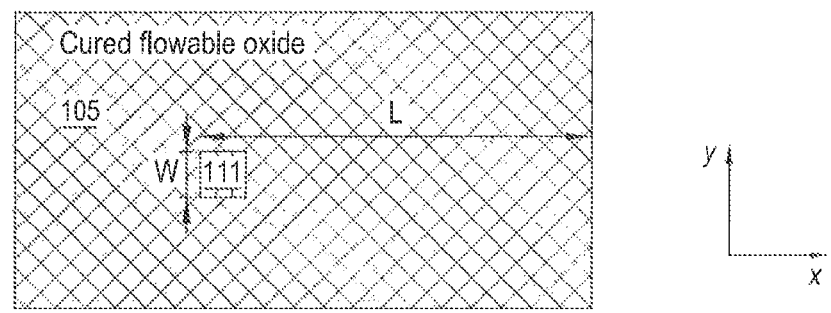
FIG. 6(d) is a schematic illustration of a cross-sectional view of the device shown in FIG. 1 through the x-y plane, through the flowable oxide layer having the localised region of ITO.

FIG. 6(d) is a schematic illustration of a cross-sectional view of the device through the x-y plane, showing the localised region of ITO 111. The ITO will extend across the entire surface above the cured flowable oxide, but extends down through the flowable oxide to contact the slab in a localised region only.

Figure 7:
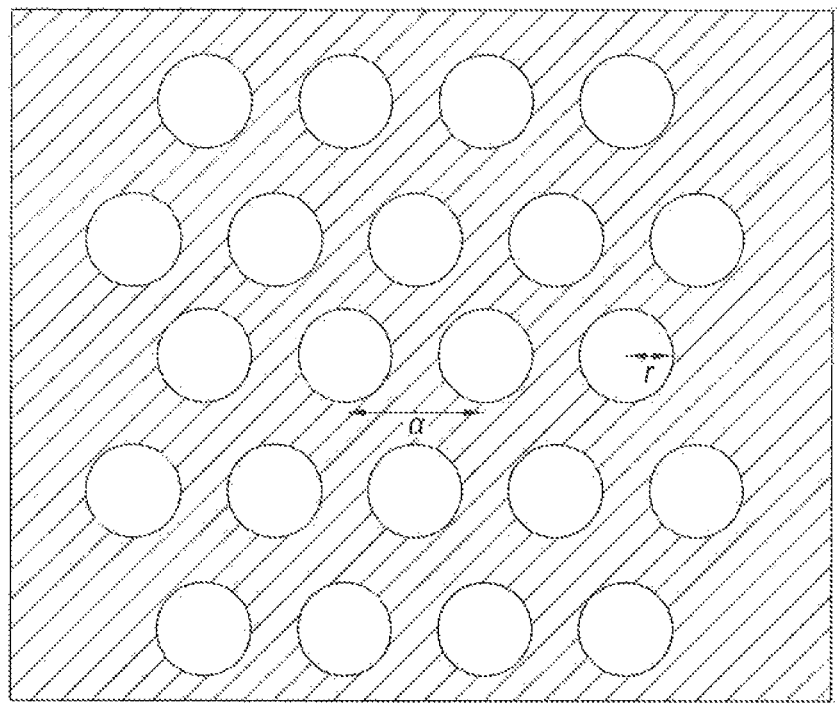
FIG. 7 is a schematic illustration of part of a photonic crystal structure with a hexagonal lattice geometry, on which the lattice constant and hole radius are indicated.

FIG. 7 shows an example of a photonic crystal structure with a hexagonal lattice geometry. Lattice constant, a, and hole radius, r, are indicated. The choice of these parameters allows tuning of the bandgap and thus tuning of the eventual propagating modes for the waveguide to the desired values. The inclusion of a defect in the periodic arrangement, for example, the waveguide region, generates certain propagation modes within the bandgap with well-defined polarisation. Such a device has been shown to efficiently transmit single photons along the plane of the layers of the device. The device provides a single mode waveguide. Although there are many separated modes in the bandgap, they do not overlap.

Figure 8:
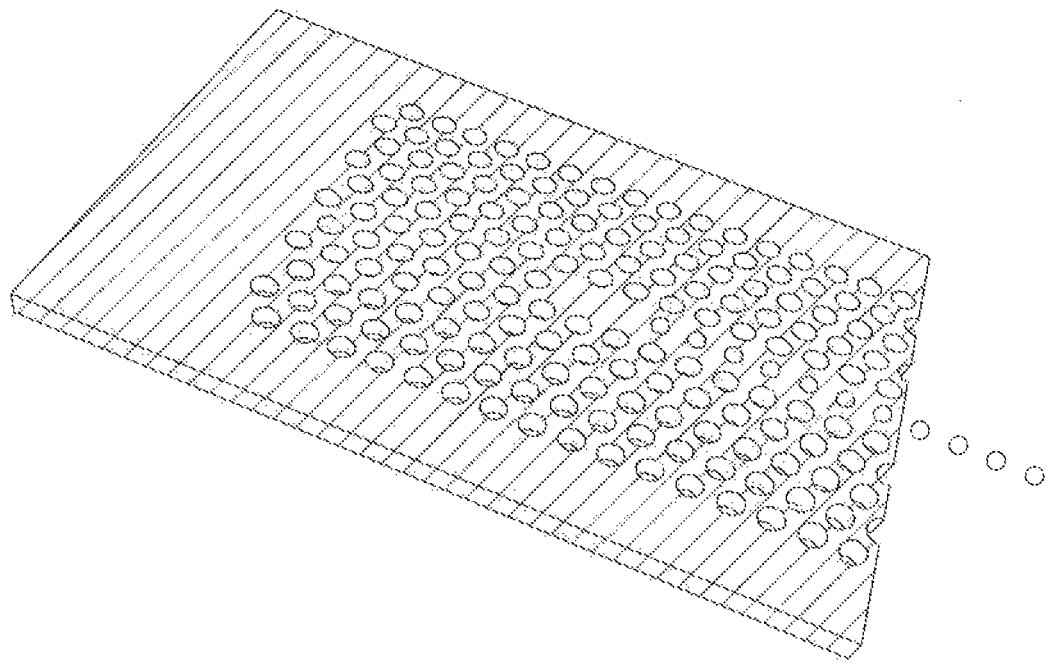
FIG. 8 is a schematic illustration of a W1 photonic crystal waveguide guiding single photons along the plane of the layers of the device.

FIG. 8 shows a schematic illustration of a W1 photonic crystal waveguide guiding single photons along the plane of the layers of the device. The inclusion of a photonic crystal mirror in one side of the waveguide assures the efficient transmission of light towards the desired direction. The waveguide is terminated on one side by a region of etched holes (on the left side in the figure). This is the photonic crystal mirror, and reflects the light towards the desired direction (towards the right hand side in the figure).

Figure 9:
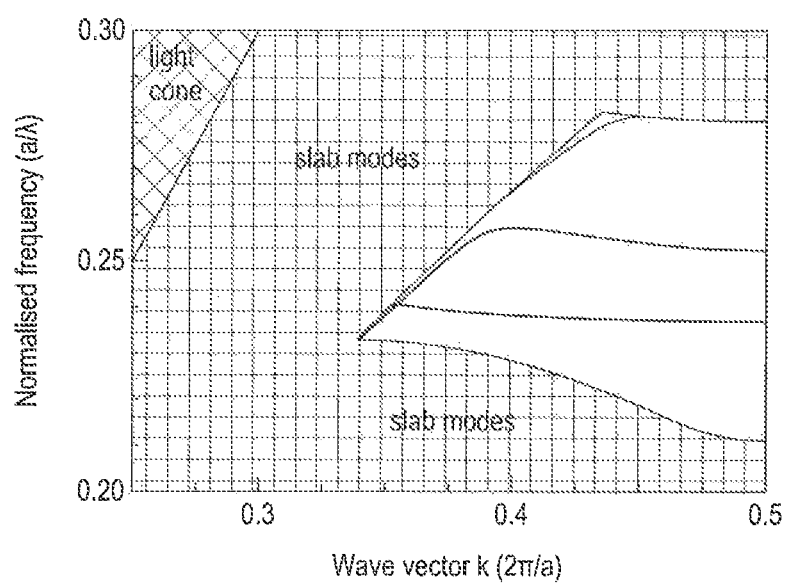
FIG. 9 shows the photonic band structure of a photonic crystal waveguide slab comprising GaAs and having a surrounding material with refractive index n=1.5.

FIG. 9 shows the photonic band structure of a photonic crystal waveguide slab comprising GaAs and having a surrounding material with refractive index n=1.5. The horizontal axis is the wave vector k, normalised such that 1 on the axis corresponds to a wave vector of $2\pi/a$. The wave vector is linked to the propagation direction. The axis runs from around 0.25 to 0.5. The vertical axis is normalised frequency, such that the value on the vertical axis corresponds to $a/\lambda$, where $\lambda$ is the wavelength. The axis runs from 0.2 to 0.3.

The photonic band gap is the entire unshaded region of the graph. Within the photonic bandgap, two y-polarised propagating modes appear, shown by the solid lines. The waveguide may contain several propagation modes. It is called a single-mode waveguide when the modes do not "cross" each other in the energy graph (or the photonic band structure). In this case, the waveguide has two modes with the same polarisation in the bandgap, but they are well-separated in energy (i.e. they do not cross each other in the graph).

The light cone defines the region in which light with a certain energy and wave vector will escape out-of-plane from the device. In other words, this light will leak out of the device, in the vertical direction. The slab modes refer to the continuum of available states where light with a certain energy and wave vector can propagate along the photonic crystal plane. This light is not confined within the waveguide.

The appearance of a photonic bandgap in photonic crystal structures requires a high refractive index contrast between the low and high index materials. In other words, the difference in refractive index between the material in the cylindrical holes and the slab material should be large. In one embodiment, the difference in the refractive index between the material in the holes and the material in the slab is greater than 1. In one embodiment, the difference in the refractive index between the material in the holes and the material in the slab is greater than 2. For a GaAs two-dimensional slab structure, the high refractive index contrast can be achieved by etching air holes with the desired array pattern geometry. The refractive index of air is n=1 and the refractive index of GaAs is n≈3.5.

In the optical device shown in FIG. 1, the waveguide structure comprises an etched array of holes in a hexagonal geometry with a line of holes omitted or missing from the lattice. The spinning of the flowable oxide fills the holes and the under-etched region. The refractive index value for a solution of hydrogen silsesquioxane is around n≈1.4.

The photonic band structure shown in FIG. 9 was obtained using simulations for a W1 photonic crystal waveguide using a material with refractive index of n=1.5 (i.e. higher than hydrogen silsesquioxane) for the holes, and n=3.5 for the GaAs surrounding region. Even for the reduced refractive index contrast case (i.e. n=1.5 rather than 1), a photonic bandgap is formed. Two y-polarised propagating modes appear within the bandgap and are used for the transfer of quantum light along the plane of the layers of the device. The values of the lattice constant and radius of the holes can be freely adjusted so that the emission energy of the embedded quantum dot is within the spectrum covered by the target propagating mode. In other words, by choosing the values of a and r, the spectrum covered by the propagating mode can be tuned so that it covers the emission energy of the quantum dot. For example, for the lowest-lying propagation mode, for a lattice constant a=250 nm, the covered wavelength range is around 17 nm.

Figure 10:
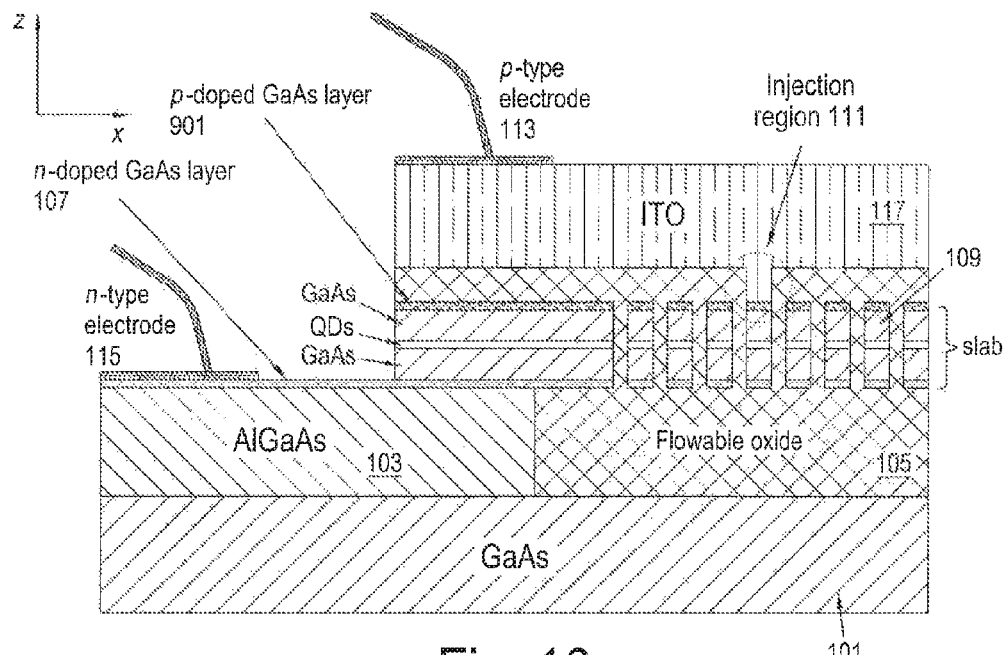
FIG. 10 is a schematic illustration of an optical device in accordance with an embodiment, the device including a layer of p-type GaAs overlying and in contact with the surface of the GaAs slab.

FIG. 10 is a schematic illustration of an optical device in accordance with an embodiment. The device is similar to that shown in FIG. 1. However, the device also includes a layer of p-type GaAs 901 overlying and in contact with the surface of the GaAs slab. When fabricating the device, an extra step is included between step S203 and S204, in which a layer of p-doped GaAs 901 is grown on top of the undoped GaAs layer 109. The mesa is then formed, and then the resist is formed on top of the structure. The design mask is transferred and the dry etching performed through the p-doped GaAs layer 901, the undoped GaAs layer 109 and the n-doped GaAs layer 107 to form the photonic crystal structure. The layer of p-type GaAs 901 is of the same order of thickness as the layer of n-doped GaAs 107. Both layers are thinner than the undoped GaAs layer 109. A layer of p-type GaAs 901 grown on the top surface of the slab allows good ohmic contact between the top p-type contact (the ITO layer) and the slab material.

In one embodiment, the p-n junction can be reversed, such that the n-type electrode forms a localised contact above the photonic crystal slab. For a reversed p-n junction, a choice of contacts with appropriate working functions for the formation of ohmic contacts at each side of the slab may be used. The p-doped GaAs layer 901 will instead be n-doped, and the n-doped GaAs layer 107 will instead be p-doped.

Figure 11:
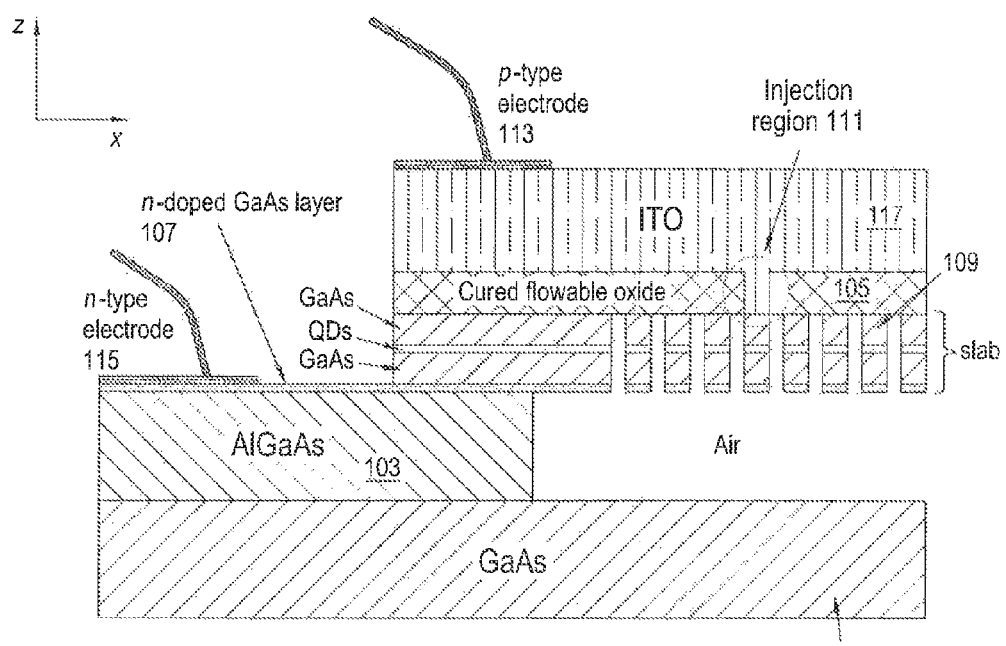
FIG. 11 is a schematic illustration of an optical device in accordance with an embodiment in which air fills the space where the sacrificial layer was removed and the cylindrical regions in the slab.

FIG. 11 is a schematic illustration of an optical device in accordance with an embodiment. The device is similar to that shown in FIG. 1. However, the flowable oxide does not fill the space where the sacrificial layer was removed, and does not fill the cylindrical regions in the slab. In this device, air fills these regions instead. For example, the flowable oxide may not fill the cylindrical holes during the spin-coating step S209 because the holes are very small (for example, the holes may be ~200 nm in diameter). The holes and region underneath the slab are thus filled with air, and the flowable oxide forms a layer on the surface of the slab. This does not prevent the operation of the device, because air also has a low refractive index of n=1.

In this embodiment, the cylindrical regions are air, having a refractive index of n=1. The waveguide propagation modes will be slightly shifted in energy if air is used to fill the cylindrical regions instead of HSQ.

Figure 12:
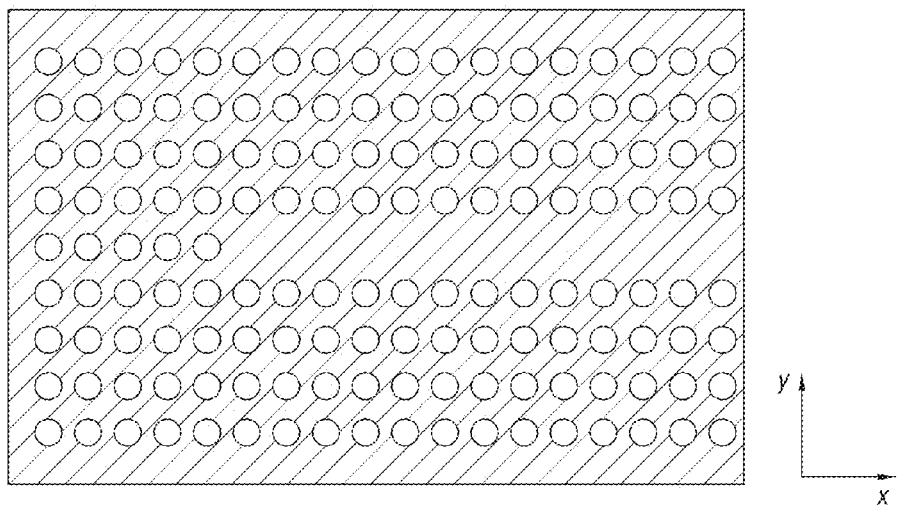
FIG. 12 is a schematic illustration of a unidirectional W1 photonic crystal waveguide slab with a square lattice geometry, which forms part of an optical device in accordance with an embodiment.

FIG. 12 is a schematic illustration of a unidirectional W1 photonic crystal waveguide slab with a square lattice geometry, which forms part of an optical device in accordance with an embodiment.

The slab in FIG. 12 is seen from above, i.e. looking down the stacking direction of the layers. The slab is a two dimensional photonic crystal waveguide and can be fabricated using nanofabrication techniques, for example as described in relation to FIG. 2.

The slab comprises a substantially regular array of substantially cylindrical holes. The holes are arranged on a square lattice. The waveguide structure is achieved by the omission of one or more lines of holes along a specific direction in the lattice. The waveguide is terminated at one end by the edge of the slab and at the other end by a line of holes.

A photonic crystal waveguide with a square lattice, such as the one depicted in FIG. 12, will have the same operation principle as a photonic crystal waveguide with a hexagonal lattice, with localised carrier injection occurring in the waveguide area.

Figure 13:
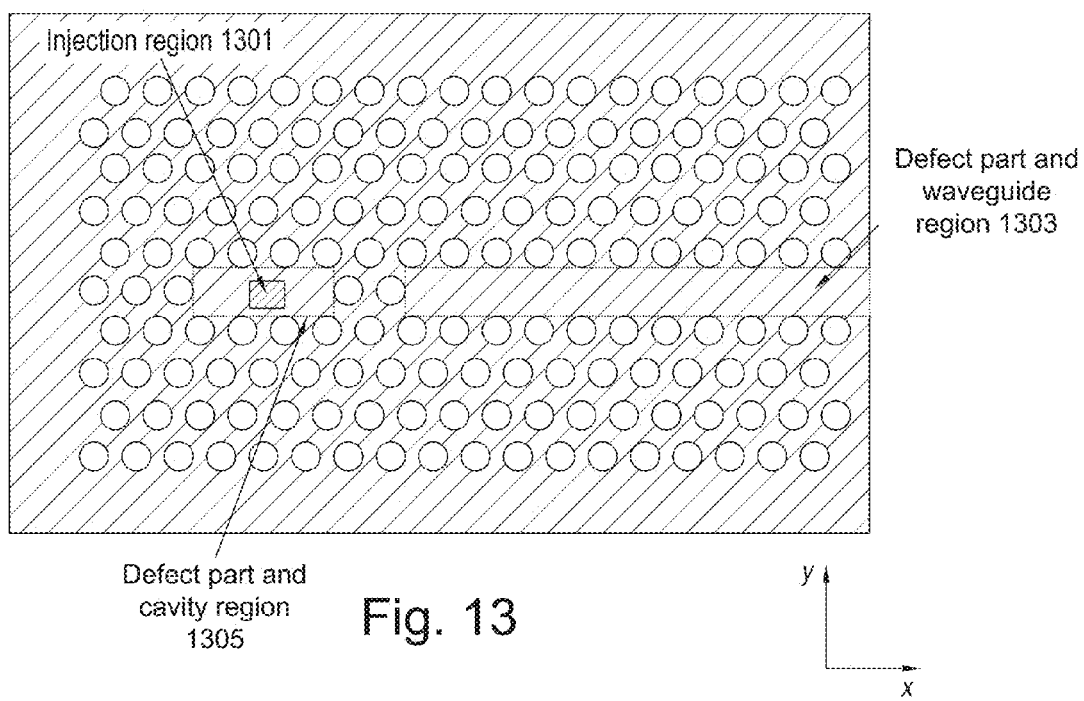
FIG. 13 is a schematic illustration of an L3-waveguide photonic crystal structure with two holes separating a cavity region and a waveguide region, which forms part of an optical device in accordance with an embodiment.

FIG. 13 is a schematic illustration of an L3-waveguide photonic crystal structure with two holes separating two defect regions, which forms part of an optical device in accordance with an embodiment. Carrier injection occurs in the L3 cavity region 1305 using the mechanism illustrated in FIG. 1, i.e. through a localised contact to the cavity region 1305. The device in FIG. 13 is a device composed of an L3 cavity 1305 coupled to a photonic crystal waveguide 1303. The device structure shown in FIG. 13 can take advantage of cavity effects in order to improve the efficiency of light emission through, for example, the Purcell effect.

The photonic crystal slab in FIG. 13 is seen from above, i.e. looking down the stacking direction of the layers. Axes labeled y and x are shown in the figure. The x and y directions are orthogonal to each other and are both in the plane of the layers. The slab is a two dimensional photonic crystal L3-waveguide and cavity structure. The photonic crystal slab can be fabricated using nanofabrication techniques, for example as described in relation to FIG. 2.

The slab comprises a substantially regular array of substantially cylindrical holes. In the slab shown in FIG. 13, the holes are arranged on a hexagonal lattice. The holes may be arranged on an alternative type of lattice, for example a square lattice. Note that if the holes are arranged on an alternative type of lattice, the cavity is no longer an L3 cavity, but will be a different type of cavity. The waveguide 1303 is formed by adjacent holes along a line being omitted, or missing, from the lattice. A cavity 1305 is located in the same line as the waveguide. In an embodiment, the cavity 1305 is formed by three adjacent missing holes along the same line as the waveguide 1303. In the figure, the waveguide 1303 is formed by ten adjacent missing holes along a line. Other numbers of missing holes can be used to form the waveguide. The missing ten holes include the hole at the edge of the slab, and the nine subsequent holes along the line. These ten missing holes form the waveguide 1303. The next two holes along the line are not missing. These holes separate the cavity 1305 from the waveguide 1303. The next three holes along the line are also missing. These three missing holes form the cavity 1305. The cavity 1305 is located at one end of the waveguide 1303. Thus the waveguide 1303 is terminated at one end by the edge of the slab and at the other end by two holes, behind which is located the cavity 1305.

In this case therefore, the fabrication of the device (for example by the process described in relation to FIG. 2) is modified in order to define the carrier injection region 1301 above the centre of the L3 cavity 1305. A quantum dot situated in the centre of the cavity 1305 with emission energy in resonance with the fundamental cavity mode will experience enhancement of the spontaneous emission rate due to the Purcell effect.

For efficient quantum dot-cavity mode coupling, the position of the quantum dot is matched with the electric field maximum. For the fundamental L3 mode, its electric field maximum is in the centre of the cavity 1305. Use of higher-order cavity modes with suitable spectral and spatial matching with the quantum dots is also possible.

Photons generated by the quantum dot in the cavity 1305 can be injected into the photonic crystal waveguide 1303. Coupling of the cavity 1305 and the waveguide 1303 is enabled by good spectral matching of the emitted photons from the cavity 1305 and the waveguide propagation mode. Efficient coupling occurs when the parity of the waveguide propagation mode matches the parity of the cavity mode. This can be easily achieved with an L3 cavity.

In an embodiment, one, two or three holes can be used to separate the cavity 1305 from the waveguide 1303. More than three holes may decrease the efficiency of the photon transmission from the cavity 1305 to the waveguide 1303.

Photonic crystal devices having localised carrier injection (and formed using the process described in relation to FIG. 2 for example) can also be used in interferometric structures formed from photonic crystal waveguides in order to integrate the quantum emitter, i.e. the quantum dot, in a photonic quantum circuit.

Figure 14:
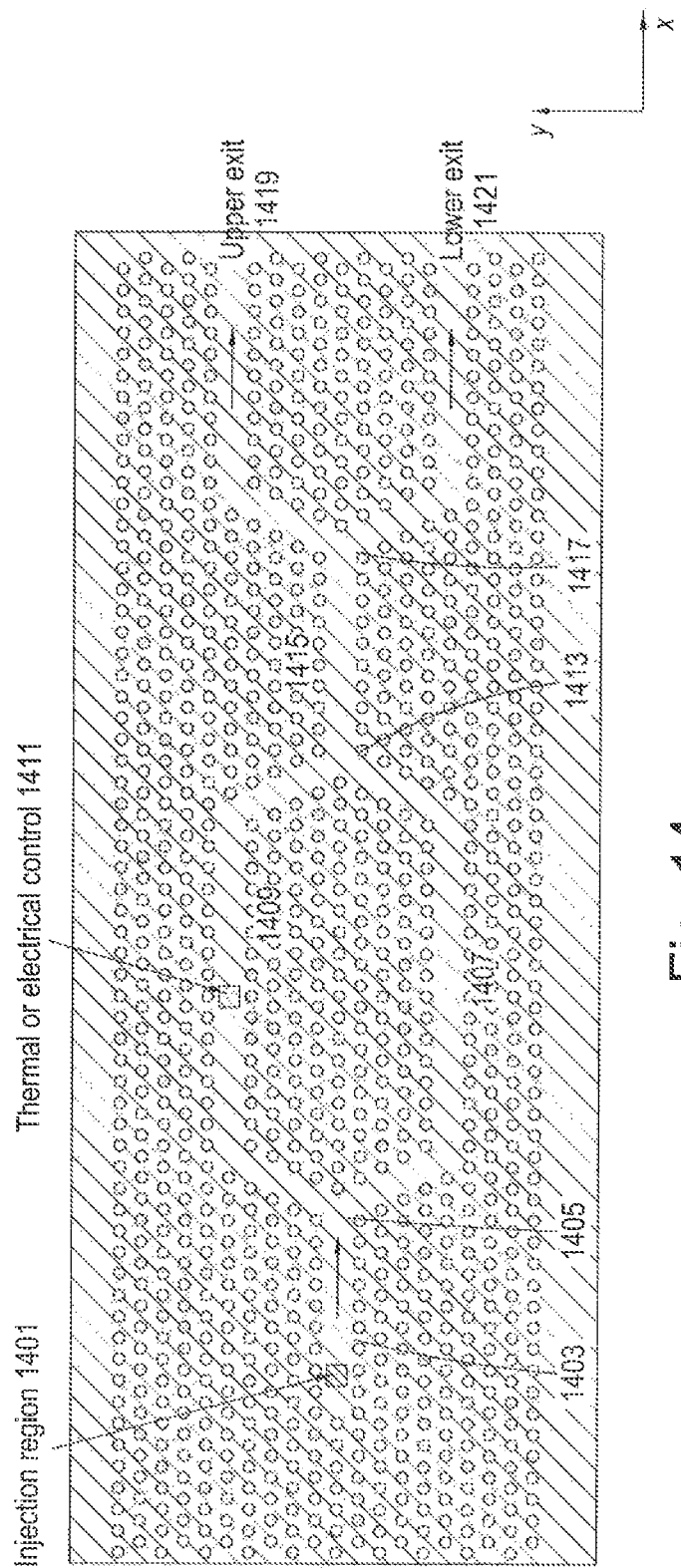
FIG. 14 is a schematic illustration of a photonic crystal slab which has a Mach-Zehnder interferometer structure, which forms part of an optical device in accordance with an embodiment.

FIG. 14 is a schematic illustration of a photonic crystal slab which forms part of an optical device in accordance with an embodiment. The photonic crystal slab structure forms a Mach-Zehnder interferometer.

The photonic crystal slab in FIG. 14 is seen from above, i.e. looking down the stacking direction of the layers. Axes labeled y and x are shown in the figure. The x and y directions are orthogonal to each other and are both in the plane of the layers. The slab is a two dimensional photonic crystal interferometer structure. The photonic crystal slab can be fabricated using nanofabrication techniques, for example as described in relation to FIG. 2.

The slab comprises a substantially regular array of substantially cylindrical holes. In the slab shown in FIG. 14, the holes are arranged on a hexagonal lattice. The holes may be arranged on an alternative type of lattice, for example a square lattice.

A waveguide 1403 is formed by adjacent holes along a line being omitted or missing. The waveguide is terminated at a first end by a line of holes. At the injection region 1401, a localised electrical contact is made to the waveguide 1403 such that carriers can be supplied to the waveguide 1403. The injection region 1401 is located near to the first end. The other end of the waveguide is terminated by a beam splitter 1405. One hole is missing from each of the five lines of holes to one side of the waveguide 1403, and one hole is missing from each of the five lines of holes the other side of the waveguide 1403, in diagonal lines. This results in two waveguides branching off diagonally from the waveguide 1403, forming a beam splitter. At the end of each branch of the beam splitter 1405, a line of adjacent holes are missing, forming a first arm of the interferometer 1407 and a second arm of the interferometer 1409. The first arm 1407 and second arm 1409 are two waveguides which are coupled to the branches of the beam splitter 1405. In the device shown, the arms are of equal length, however, by missing more holes on one arm than the other, an asymmetric Mach-Zehnder interferometer can be formed.

A localised contact is also made to the second arm 1409. This allows thermal or electrical control of the phase of photons travelling through the second arm 1409.

The ends of the arms combine at combiner 1413. Combiner 1413 comprises two diagonal branches, one coupled to the end of first arm 1407 and one coupled to the end of second arm 1409. Both branches couple to the end of a waveguide 1415, formed by an adjacent line of holes which are missing. The other end of waveguide 1415 is coupled to a second beam splitter 1417. The two diagonal branches of beam splitter 1417 are each connected to waveguides. Each waveguide is formed by an adjacent line of holes which are missing, and each terminates at the edge of the slab. One waveguide forms the upper exit 1419 and the other waveguide forms the lower exit 1421.

The fabrication of the device (for example by the process described in relation to FIG. 2) is modified in order to define the carrier injection region above the waveguide 1403 and to form the interferometer structure by the omission of the appropriate holes. The localised injection region is located on the left hand side of the photonic crystal structure as shown in the figure. A quantum dot in the active region can be electrically excited by injection of carriers and emit a single photon along the plane of the layers.

In its simplest form, the interferometer can be used as a single-qubit gate. Whether a photon which is emitted from the active region is detected at the upper exit 1419 or the lower exit 1421 is determined by the relative phase difference between the first arm 1407 and the second arm 1409 of the interferometer. In this example, the phase of a photon travelling through the second arm 1409 of the interferometer can be altered using the localised contact for thermal or electrical control 1411. The method of control used depends on the choice of the slab material.

A cavity-waveguide structure similar to that illustrated in FIG. 13 can also be included in conjunction with the interferometer structure for efficient light emission.

The basic design of a photonic crystal structure having a localised contact can be extended in order to incorporate several photonic crystal waveguides, cavities, directional couplers and localised injection regions for in-plane single-photon emission to realize more sophisticated architectures that contain several integrated quantum light sources.

Localised electrical injection of carriers in photonic crystal structures can also be used for devices emitting quantum light out-of-plane.

Figure 15:
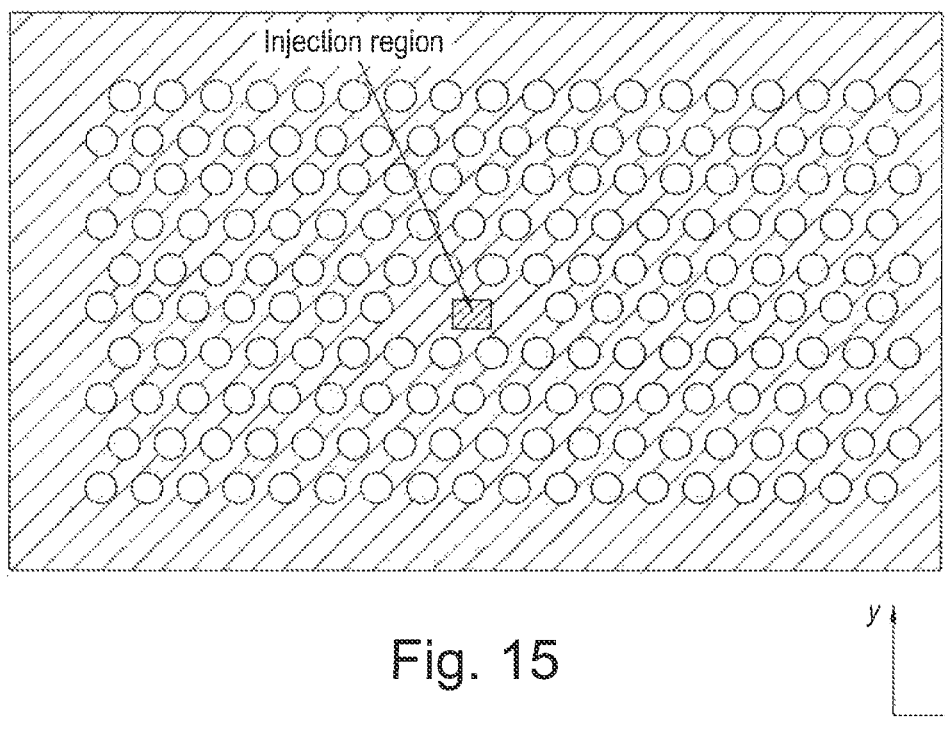
FIG. 15 is a schematic illustration of a photonic crystal slab comprising a photonic crystal L3 cavity for out of plane light emission, which forms part of an optical device in accordance with an embodiment.

FIG. 15 is a schematic illustration of a photonic crystal slab which forms part of an optical device in accordance with an embodiment. The slab comprises a photonic crystal L3 cavity. Other examples of photonic crystal cavities which can be formed are H1 cavities, L5 cavities and L7 cavities. The cavity is formed from three adjacent missing holes in the hexagonal lattice arrangement. Using similar fabrication steps and wafer structure as described in relation to FIGS. 1, 2 and 3, a region of ITO contacts a small region in the centre of the cavity. The rest of the structure is covered by HSQ, which provides electrical insulation. The ITO provides an electrical contact between the region at the centre of the cavity and an electrode. The HSQ insulates the rest of the structure from the electrode, such that the electrode is in electrical contact with the centre of the cavity only.

The transparency of ITO allows for efficient out-of-plane light extraction. Single QDs which are in the active region in the cavity will be electrically excited by injection of carriers and emit single photons. Emission of entangled photons is also possible through the biexciton radiative cascade emission. The out-of-plane emission in such devices is enhanced by the photonic crystal region surrounding the QD. Light emitted from the QD cannot propagate along the plane due to the forbidden photonic bandgap, and exits in the out-of-plane direction.

Furthermore, provided that there is a good spectral match with the L3 cavity mode, the spontaneous emission rate of the QD can be enhanced through the Purcell effect. Spatial matching of the QD with the maximum of the electric field of the cavity mode leads to the enhancement of the spontaneous emission rate through the Purcell effect. Being above the centre of the cavity, the injection region allows for the electrical excitation of QDs that spatially match the electric field maxima of several cavity modes (including the fundamental mode).

For sources of quantum light, carrier injection may be performed by optical excitation. Quantum dots may be implemented in photonic crystal waveguides for on-chip generation and the in-plane transmission of single photons in devices operating under optical excitation. Alternatively, electrical injection of carriers in photonic crystal structures using a lateral p-i-n structure can be employed.

In p-i-n mesa structure where the photonic crystal region covers only a small portion of the mesa and the top electrode is contacted to the entire surface of the mesa, when a voltage is applied between the top and bottom electrodes, it is easier for most of the carriers to travel vertically in the region outside of the photonic crystal. The holes in the photonic crystal region prevent current flowing freely in the photonic crystal region. The presence of holes in a photonic crystal slab and surface states in the walls of the holes means that most of the carrier injection occurs outside of the desired (waveguide) region.

In an embodiment, carrier injection in an optical device is performed using a vertical p-i-n junction. The device design allows the localised injection of the carriers in a desired location. The localised injection of carriers can be achieved with high accuracy using nanofabrication techniques to produce the device. The device enables the efficient injection of carriers in the quantum dot.

The optical device may be configured for on-chip electrical generation and in-plane transfer of single photons. The implementation of a source of quantum light in a photonic quantum circuit involves electrical control and on-demand emission of single photons. Such optical device structures are low cost, use simple nanofabrication processing, and can be employed for the generation of single photons. The optical device can be used in on chip photonic quantum circuits, as an integrated in-plane source of single, indistinguishable and/or entangled photons. The quantum light source can be used in practical on-chip integrated devices.

The optical device may be an electrically pumped in-plane quantum light source. The device utilizes the electrical injection of carriers in a photonic crystal structure for the generation of quantum light and its transmission along a semiconductor chip. Light is transmitted along the semiconductor chip by a photonic crystal slab. A layer of semiconductor quantum dots are in the centre of the slab. The quantum dots are used as the emitters of single photons. Electrical injection occurs via a vertical p-i-n structure, with an n-doped semiconductor layer at the bottom of the slab and a p-type material that can be deposited at a later stage using nanofabrication methods. A layer of flowable oxide between the slab and the p-type material provides insulation. Lithographically-defined holes on the thermally treated flowable oxide before the deposition of the p-type material allows for localised electrical injection.

The optical device may be configured such that there is precise electrical injection of carriers in a photonic crystal waveguide, for in-plane generation and transmission of quantum light. A transparent top contact (formed by the ITO region) allows high precision definition of the location where the carriers are to be injected. A device having a transparent top contact can be used in devices where light is emitted in the out-of-plane direction (vertically from the device), i.e. in the stacking direction of the layers. Such a device comprises a photonic crystal cavity, and a transparent electrode could be used to inject carriers into the cavity region without affecting the cavity quality and characteristics.

An insulating flowable oxide layer means that carrier injection is restricted only to the desired location. Additionally, the use of flowable oxide and ITO does not affect the operation of the waveguide, i.e. the refractive index contrast in the slab is still high enough.

A photonic crystal cavity allows control over the emission of quantum light, in the form of single, indistinguishable and/or entangled photons, when coupled to a quantum emitter, for example a quantum dot. Photonic crystal waveguides can efficiently transmit the quantum light along the plane of the chip. The optical device allows electrical injection of carriers in photonic crystal structures. The photonic crystal structure is an integrated quantum light source. The use of a low-refractive index insulating oxide in the photonic crystal structure allows for localised carrier injection in the desired region, without reduction in the photonic crystal performance. The electrical injection method can be used in both cavity and waveguide structures, allowing for the electrical generation and transfer of quantum light along the plane of the chip.

While certain embodiments have been described, these embodiments have been presented by way of example only, and are not intended to limit the scope of the inventions. Indeed the novel methods and apparatus described herein may be embodied in a variety of other forms; furthermore, various omissions, substitutions and changes in the form of methods and apparatus described herein may be made without departing from the spirit of the inventions. The accompanying claims and their equivalents are intended to cover such forms of modifications as would fall within the scope and spirit of the inventions.

The invention claimed is:

1. An optical device, comprising:
   a photonic crystal structure, comprising:
      a layer of a first material, the layer comprising a quantum emitter;
      a plurality of regions of a second material in the layer of the first material, the regions arranged in a regular lattice having at least one region missing from the lattice so that a defect is formed, wherein the quantum emitter is located in a defect part of the photonic crystal structure;
   wherein the second material has a different refractive index to the first material;
   a solid layer of electrically insulating material overlying and in contact with the layer of the first material; and
   a region of a third material in the solid layer of the electrically insulating material, which overlies and is in contact with a surface of the layer of the first material at the defect part of the photonic crystal structure, wherein the third material is electrically conducting.

2. The optical device of claim 1, further comprising:
   an electrode, which is electrically contacted to the defect part through the third material.

3. The optical device of claim 2, wherein the electrically insulating material is the same as the second material.

4. The optical device of claim 1, wherein the second material has a refractive index of less than 1.6 and is suitable for use as an electron-beam resist.

5. The optical device of claim 1, wherein the second material is hydrogen silsesquioxane.

6. The optical device of claim 1, wherein the photonic crystal structure is overlying and in contact with a material having a lower refractive index than the first material.

7. The optical device of claim 1, wherein the photonic crystal structure is overlying and in contact with a layer comprising a material which is the same as the second material.

8. The optical device of claim 2, wherein the electrode is a p-type electrode and further comprising:
   an n-type electrode that is electrically contacted to the opposite surface of the photonic crystal structure to the p-type electrode, forming a p-n junction in a direction substantially perpendicular to a plane of the layers.

9. The optical device of claim 1, wherein the first material is a semiconducting material.

10. The optical device of claim 1, wherein the first material is GaAs and wherein the layer of the first material comprises a layer of low density InAs quantum dots.

11. The optical device of claim 2, wherein the third material is indium tin oxide.

12. The optical device of claim 1, wherein the defect part is a waveguide region along a direction substantially parallel to the plane of the layer.

13. The optical device of claim 1, wherein the defect part is a cavity region.

14. The optical device of claim 13, further comprising:
a waveguide region which is a second defect part of the lattice formed by a plurality of regions of the second material missing from the lattice; and
wherein the waveguide region is optically coupled to the cavity region.

15. The optical device of claim 1, further comprising:
an interferometer which is a plurality of defect parts of the lattice formed by a plurality of regions of the second material missing from the lattice; and
wherein the interferometer is optically coupled to the defect part in which the quantum emitter is located.

* * * * *